United States Patent
Anthony et al.

(10) Patent No.: US 7,110,227 B2
(45) Date of Patent: Sep. 19, 2006

(54) UNIVERSIAL ENERGY CONDITIONING INTERPOSER WITH CIRCUIT ARCHITECTURE

(75) Inventors: Anthony A. Anthony, Erie, PA (US); William M. Anthony, Erie, PA (US)

(73) Assignee: X2Y Attenuators, LLC, Erie, PA (US)

( * ) Notice: Subject to any disclaimer, the term of this patent is extended or adjusted under 35 U.S.C. 154(b) by 558 days.

(21) Appl. No.: 10/237,079

(22) Filed: Sep. 9, 2002

(65) Prior Publication Data

US 2003/0206388 A9 Nov. 6, 2003

Related U.S. Application Data

(63) Continuation-in-part of application No. 09/600,530, filed as application No. PCT/US99/01040 on Jan. 16, 1999, now Pat. No. 6,498,710, which is a continuation-in-part of application No. 09/632,048, filed on Aug. 3, 2000, which is a continuation-in-part of application No. 09/594,447, filed on Jun. 15, 2000, which is a continuation-in-part of application No. 09/579,606, filed on May 26, 2000, now Pat. No. 6,373,673, which is a continuation-in-part of application No. 09/460,218, filed on Dec. 13, 1999, now Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/203,863, filed on May 12, 2000, provisional application No. 60/200,327, filed on Apr. 28, 2000, provisional application No. 60/185,320, filed on Feb. 28, 2000, provisional application No. 60/180,101, filed on Feb. 3, 2000, provisional application No. 60/165,035, filed on Nov. 12, 1999, provisional application No. 60/146,987, filed on Aug. 3, 1999, provisional application No. 60/139,182, filed on Jun. 15, 1999, provisional application No. 60/136,451, filed on May 28, 1999, provisional application No. 60/215,314, filed on Jun. 30, 2000, and provisional application No. 60/191,196, filed on Mar. 22, 2000.

(51) Int. Cl.
*H02H 9/00* (2006.01)

(52) U.S. Cl. .............................. 361/56; 361/58; 361/118
(58) Field of Classification Search .................. 361/15, 361/18, 58, 111, 113, 117, 118, 127, 120, 361/91.1

See application file for complete search history.

(56) References Cited

U.S. PATENT DOCUMENTS

| 3,240,621 A | 3/1966 | Flower, Jr. et al. |
| 3,343,034 A | 9/1967 | Ovshinsky |

(Continued)

FOREIGN PATENT DOCUMENTS

| DE | 197 28 692 A1 | 1/1999 |
| DE | 198 57 043 C1 | 3/2000 |

(Continued)

OTHER PUBLICATIONS

PCT International Search Report for International Application No. PCT/US/98/06962.

(Continued)

*Primary Examiner*—Stephen W. Jackson
(74) *Attorney, Agent, or Firm*—Neifeld IP Law, PC

(57) ABSTRACT

The present invention relates to an interposer substrate for interconnecting between active electronic componentry such as but not limited to a single or multiple integrated circuit chips in either a single or a combination and elements that could comprise of a mounting substrate, substrate module, a printed circuit board, integrated circuit chips or other substrates containing conductive energy pathways that service an energy utilizing load and leading to and from an energy source. The interposer will also possess a multi-layer, universal multi-functional, common conductive shield structure with conductive pathways for energy and EMI conditioning and protection that also comprise a commonly shared and centrally positioned conductive pathway or electrode of the structure that can simultaneously shield and allow smooth energy interaction between grouped and energized conductive pathway electrodes containing a circuit architecture for energy conditioning as it relates to integrated circuit device packaging. The invention can be employed between an active electronic component and a multilayer circuit card. A method for making the interposer is not presented and can be varied to the individual or proprietary construction methodologies that exist or will be developed.

61 Claims, 5 Drawing Sheets

U.S. PATENT DOCUMENTS

| | | | |
|---|---|---|---|
| 3,573,677 A * | 4/1971 | Detar ........................ 333/79 |
| 3,742,420 A | 6/1973 | Hamden, Jr. |
| 3,790,858 A | 2/1974 | Brancaleone et al. |
| 3,842,374 A | 10/1974 | Schlicke |
| 4,023,071 A | 5/1977 | Fussell |
| 4,119,084 A | 10/1978 | Eckels |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,612,140 A | 9/1986 | Mandai |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,540 A | 12/1987 | Takamine |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A * | 6/1993 | Kershaw, Jr. et al. ........ 361/117 |
| 5,236,376 A | 8/1993 | Cohen |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A * | 2/1996 | Naylor et al. ................ 174/36 |

| Patent No. | Date | Name |
|---|---|---|
| 5,493,260 A | 2/1996 | Park |
| 5,495,180 A | 2/1996 | Huang et al. |
| 5,500,629 A | 3/1996 | Meyer |
| 5,500,785 A | 3/1996 | Funada |
| 5,512,196 A | 4/1996 | Mantese et al. |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |
| 5,546,058 A | 8/1996 | Azuma et al. |
| 5,548,255 A | 8/1996 | Spielman |
| 5,555,150 A | 9/1996 | Newman, Jr. |
| 5,568,348 A | 10/1996 | Foreman et al. |
| 5,570,278 A | 10/1996 | Cross |
| 5,583,359 A | 12/1996 | Ng et al. |
| 5,586,007 A | 12/1996 | Funada |
| 5,592,391 A | 1/1997 | Muyshondt et al. |
| 5,612,657 A | 3/1997 | Kledzik |
| 5,614,881 A | 3/1997 | Duggal et al. |
| 5,619,079 A | 4/1997 | Wiggins et al. |
| 5,624,592 A | 4/1997 | Paustian |
| 5,640,048 A | 6/1997 | Selna |
| 5,645,746 A | 7/1997 | Walsh |
| 5,647,766 A | 7/1997 | Nguyen |
| 5,668,511 A | 9/1997 | Furutani et al. |
| 5,682,303 A | 10/1997 | Goad |
| 5,700,167 A | 12/1997 | Pharney et al. |
| 5,708,553 A | 1/1998 | Hung |
| 5,719,450 A | 2/1998 | Vora |
| 5,719,477 A | 2/1998 | Tomihari |
| 5,719,750 A | 2/1998 | Iwane |
| 5,751,539 A | 5/1998 | Stevenson et al. |
| 5,767,446 A | 6/1998 | Ha et al. |
| 5,789,999 A | 8/1998 | Barnett et al. |
| 5,790,368 A | 8/1998 | Naito et al. |
| 5,796,568 A | 8/1998 | Baiatu |
| 5,796,595 A | 8/1998 | Cross |
| 5,797,770 A | 8/1998 | Davis et al. |
| 5,808,873 A | 9/1998 | Celaya et al. |
| 5,825,628 A | 10/1998 | Garbelli et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,838,216 A | 11/1998 | White et al. |
| 5,867,361 A | 2/1999 | Wolf et al. |
| 5,870,272 A | 2/1999 | Seifried et al. |
| 5,875,099 A | 2/1999 | Maesaka et al. |
| 5,880,925 A | 3/1999 | DuPre et al. |
| 5,889,445 A | 3/1999 | Ritter et al. |
| 5,895,990 A | 4/1999 | Lau |
| 5,898,403 A | 4/1999 | Saitoh et al. |
| 5,898,562 A | 4/1999 | Cain et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A * | 6/1999 | Anthony ...................... 361/118 |
| 5,910,755 A | 6/1999 | Mishiro et al. |
| 5,912,809 A | 6/1999 | Steigerwald et al. |
| 5,917,388 A | 6/1999 | Tronche et al. |
| 5,926,377 A | 7/1999 | Nakao et al. |
| 5,928,076 A | 7/1999 | Clements et al. |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,977,845 A | 11/1999 | Kitahara |
| 5,978,231 A | 11/1999 | Tohya et al. |
| 5,980,718 A | 11/1999 | Van Konynenburg et al. |
| 5,995,352 A | 11/1999 | Gumley |
| 5,999,067 A | 12/1999 | D'Ostillo |
| 5,999,398 A | 12/1999 | Makl et al. |
| 6,004,752 A | 12/1999 | Loewy et al. |
| 6,013,957 A | 1/2000 | Puzo et al. |
| 6,016,095 A | 1/2000 | Herbert |
| 6,018,448 A * | 1/2000 | Anthony ...................... 361/56 |
| 6,021,564 A | 2/2000 | Hanson |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,042,685 A | 3/2000 | Shinada et al. |
| 6,046,898 A | 4/2000 | Seymour et al. |
| 6,052,038 A | 4/2000 | Savicki |
| 6,061,227 A | 5/2000 | Nogi |
| 6,064,286 A | 5/2000 | Ziegner et al. |
| 6,072,687 A | 6/2000 | Naito et al. |
| 6,075,211 A | 6/2000 | Tohya et al. |
| 6,078,117 A | 6/2000 | Perrin et al. |
| 6,078,229 A | 6/2000 | Funada et al. |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A * | 8/2000 | Anthony ...................... 361/56 |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,231 B1 | 1/2001 | Bartilson |
| 6,183,685 B1 | 2/2001 | Cowman et al. |
| 6,185,091 B1 | 2/2001 | Tanahashi et al. |
| 6,188,565 B1 | 2/2001 | Naito et al. |
| 6,191,475 B1 | 2/2001 | Skinner et al. |
| 6,191,669 B1 | 2/2001 | Shigemura |
| 6,191,932 B1 | 2/2001 | Kuroda et al. |
| 6,195,269 B1 | 2/2001 | Hino |
| 6,198,123 B1 | 3/2001 | Linder et al. |
| 6,198,362 B1 | 3/2001 | Harada et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |

| | | |
|---|---|---|
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,078 B1 | 4/2001 | Hunt et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,292,350 B1 | 9/2001 | Naito et al. |
| 6,292,351 B1 | 9/2001 | Ahiko et al. |
| 6,309,245 B1 | 10/2001 | Sweeney |
| 6,310,286 B1 | 10/2001 | Troxel et al. |
| 6,313,584 B1 | 11/2001 | Johnson et al. |
| 6,320,547 B1 | 11/2001 | Fathy et al. |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamamoto et al. |
| 6,331,926 B1 | 12/2001 | Anthony |
| 6,331,930 B1 | 12/2001 | Kuroda |
| 6,342,681 B1 | 1/2002 | Goldberger et al. |
| 6,373,673 B1 | 4/2002 | Anthony |
| 6,388,856 B1 | 5/2002 | Anthony |
| 6,395,996 B1 * | 5/2002 | Tsai et al. .................. 174/260 |
| 6,448,873 B1 | 9/2002 | Mostov |
| 6,456,481 B1 | 9/2002 | Stevenson |
| 6,469,595 B1 | 10/2002 | Anthony et al. |
| 6,498,710 B1 * | 12/2002 | Anthony .................. 361/111 |
| 6,504,451 B1 | 1/2003 | Yamaguchi |
| 6,509,807 B1 | 1/2003 | Anthony et al. |
| 6,510,038 B1 | 1/2003 | Satou et al. |
| 6,522,516 B1 | 2/2003 | Anthony |
| 6,549,389 B1 | 4/2003 | Anthony et al. |
| 6,563,688 B1 | 5/2003 | Anthony et al. |
| 6,580,595 B1 | 6/2003 | Anthony et al. |
| 6,594,128 B1 | 7/2003 | Anthony |
| 6,603,372 B1 | 8/2003 | Ishizaki et al. |
| 6,603,646 B1 | 8/2003 | Anthony et al. |
| 6,606,011 B1 | 8/2003 | Anthony et al. |
| 6,606,237 B1 | 8/2003 | Naito et al. |
| 6,618,268 B1 | 9/2003 | Dibene, II et al. |
| 6,636,406 B1 | 10/2003 | Anthony |
| 6,650,525 B1 | 11/2003 | Anthony |
| 6,687,108 B1 | 2/2004 | Anthony et al. |
| 6,696,952 B1 | 2/2004 | Zirbes |
| 6,717,301 B1 | 4/2004 | De Daran et al. |
| 6,738,249 B1 | 5/2004 | Anthony et al. |
| 6,806,806 B1 | 10/2004 | Anthony |
| 6,873,513 B1 | 3/2005 | Anthony |
| 6,894,884 B1 | 5/2005 | Anthony, Jr. et al. |
| 6,950,293 B1 | 9/2005 | Anthony |
| 6,954,346 B1 | 10/2005 | Anthony |
| 6,995,983 B1 | 2/2006 | Anthony et al. |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0075096 A1 | 6/2002 | Anthony |
| 2003/0048029 A1 | 3/2003 | DeDaran et al. |
| 2003/0067730 A1 | 4/2003 | Anthony et al. |

FOREIGN PATENT DOCUMENTS

| | | |
|---|---|---|
| EP | 0933871 | 8/1999 |
| EP | 1022751 | 7/2000 |

| | | |
|---|---|---|
| EP | 1024507 | 8/2000 |
| EP | 1061535 | 12/2000 |
| FR | 2765417 | 12/1998 |
| FR | 2808135 | 10/2001 |
| GB | 2217136 | 4/1988 |
| JP | 63-269509 | 11/1988 |
| JP | 1-27251 | 1/1989 |
| JP | 02-267879 | 11/1990 |
| JP | 03-018112 | 1/1991 |
| JP | 5-283284 | 10/1993 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 06-151614 | 5/1994 |
| JP | 06-325977 | 11/1994 |
| JP | 07-235406 | 9/1995 |
| JP | 07-235852 | 9/1995 |
| JP | 07-240651 | 9/1995 |
| JP | 08-124795 | 5/1996 |
| JP | 08-163122 | 6/1996 |
| JP | 08-172025 | 7/1996 |
| JP | 09-284077 | 10/1997 |
| JP | 09-284078 | 10/1997 |
| JP | 9-294041 | 11/1997 |
| JP | 11-21456 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO 91/15046 | 10/1991 |
| WO | WO 98/45921 | 10/1998 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/33798 | 4/2002 |
| WO | WO 02/1227794 | 4/2002 |
| WO | WO 02/45233 | 6/2002 |
| WO | WO 02/65606 | 8/2002 |
| WO | WO 02/080330 | 10/2002 |
| WO | WO 03/005541 | 1/2003 |

OTHER PUBLICATIONS

PCT International Search Report for International Application No. PCT/US99/01040 Apr. 19, 1999.

PCT International Search Report for International Application No. PCT/US99/07653 Jul. 19, 1999.

PCT International Search Report for International Application No. PCT/US00/11409 Sep. 18, 2000.

PCT International Search Report for International Application No. PCT/US00/14626 Sep. 13, 2000.

PCT International Search Report for International Application No. PCT/US00/16518 Nov. 8, 2000.

PCT International Search Report for PCT/US01/48861 Oct. 1, 2002.

PCT International Search Report for PCT/US01/44681 Jan. 2, 2003.

Greb, "An Intuitive Approach to EM Fields," EMC Test & Design Jan. 1, 1991, pp. 30–33.

Greb, "An Intuitive Approach to EM Coupling," EMC Test & Design, Dec. 1, 1993, pp. 20–25.

Sakamoto, "Noiseproof Power Supplies: What's Important in EMI Removal Filters?" JEE, Jun. 1, 1986, pp. 80–85.

Montrose, "Analysis on Loop Area Trace Radiated Emissions from Decoupling Capacitor Placement on Printed Circuit Boards," IEEE, Jan. 1, 1999, pp. 423–428.

Miyoshi, "Surface Mounted Distributed Constant Type Noise Filter," IEEE, Jan. 1, 1999, pp. 157–160.

Shigeta et al., "Improved EMI Performance by Use of a Three–Terminal–Capacitor Applied to an IC Power Line," IEEE, Jan. 1, 1999, pp. 161–164.

PCT International Search Report for PCT/US99/07653 Jul. 19, 1999.

IPER for PCT/US99/07653 Oct. 13, 1999.

U.S. Appl. No. 10/479,506, Claims 1–46 from Preliminary Amendment filed Dec. 10, 2003.

U.S. Appl. No. 10/189,339, Claims 1–41 from Preliminary Amendment filed Oct. 28, 2003.

U.S. Appl. No. 10/443,792, Claims 1–41 from Preliminary Amendment filed Oct. 28, 2003.

PCT International Search Report for PCT/US98/06962 Aug. 19, 1998.

PCT International Search Report for PCT/US99/01040 Apr. 19, 1999.

PCT International Search Report for PCT/US00/11409 Sep. 18, 2000.

PCT International Search Report for PCT/US00/14626 Sep. 13, 2000.

PCT International Search Report for PCT/US00/16518 Nov. 8, 2000.

PCT International Search Report for PCT/US00/21178 Dec. 28, 2000.

Fang et al., "Conductive Polymers Prolong Circuit Life," Design News, date unknown, 3 pages.

Carpenter, Jr. et al., "A New Approach to TVSS Design," Power Quality Assurance, Sep./Oct. 1996 p. 60–63 Sep. 1, 1996.

Raychem, "Polyswitch Resettable Fuses," Circuit Protection Databook, Jan. 1, 1996, pp. 11–18.

PCT International Search Report for PCT/US01/41720 Dec. 28, 2001.

PCT International Search Report for PCT/US01/09185 Jun. 13, 2001.

Polka et al., "Package–Level Interconnect Design for Optimum Electrical Performance," Intel Technology Journal Q3, 2000, pp. 1–17 Jul. 1, 2000.

PCT International Search Report for PCT/US01/43418 May 10, 2002.

PCT International Search Report for PCT/US01/32480 Mar. 13, 2002.

PCT International Search Report for PCT/US02/10302 Aug. 19, 2002.
PCT International Search Report for PCT/US02/21238 Feb. 28, 2003.
PCT International Search Report for PCT/US01/13911 Mar. 18, 2002.
PCT International Search Report for PCT/US91/03792 Jul. 16, 1991.
PCT International Search Report for PCT/US01/03792 Jun. 28, 2001.
"Johanson Dielectrics, Inc. Licenses X2Y Circuit Conditioning Technology," Press Release, Dec. 16, 1998, 1 page.
Beyne et al., "PSGA—an innovative IC package for single and multichip designs," Components, Mar. 1, 1997, pp. 6–9.
"EMC Design for Brush Commutated DC Electric Motors," Sep. 15, 1997, pp. 1–2.
"Tomorrow's Capacitors," Components, 1996, No. 4 p. 3 Apr. 1, 1996.
Mason, "Valor—Understanding Common Mode Noise," Mar. 30, 1996, pp. 1–7.
Pending specification, claims, figures for U.S. Appl. No. 10/237,079, Claims 21–81; filed Sep. 9, 2002 Anthony Anthony et al.
Pending specification, claims, figures for U.S. Appl. No. 10/766,000, Claims 1–63; filed Jan. 29, 2004 David Anthony et al.
Pending specification, claims, figures for U.S. Appl. No. 10/399,630, Claims 1–35; filed Aug. 27, 2003 William Anthony.
Pending specification, claims, figures for U.S. Appl. No. 10/432,840, Claims 1–39; filed May 28, 2003 Anthony Anthony et al.
Pending specification, claims, figures for U.S. Appl. No. 10/443,482, Claims 1–25; filed Jun. 12, 2003 William Anthony.
Pending specification, claims, figures for U.S. Appl. No. 10/435,199, claims 1–32; filed May 12, 2003 Anthony Anthony et al.
Pending specification, claims, figures for U.S. Appl. No. 10/115,159, Claims 1–31; filed Apr. 2, 2002 Anthony Anthony et al.
Pending specification, claims, figures for U.S. Appl. No. 10/189,338, Claims 1–69; filed Jul. 2, 2002 Anthony Anthony et al.
Pending specification, claims, figures for U.S. Appl. No. 10/189,339, Claims 1–41; filed Jul. 2, 2002 Anthony Anthony et al.
Pending specification, claims, figures for U.S. Appl. No. 10/479,506, Claims 1–46; filed Dec. 10, 2003 Anthony Anthony et al.
Pending specification, claims, figures for U.S. Appl. No. 10/443,764, Claims 26–40; filed Sep. 16, 2003 Anthony Anthony.
Pending specification, claims, figures for U.S. Appl. No. 10/443,792, Claims 1–41; May 23, 2003 Anthony Anthony.
Pending specification, claims, figures for U.S. Appl. No. 10/443,788, Claims 1: 21–45; filed May 23, 2003 Anthony Anthony.
Pending specification, claims, figures for U.S. Appl. No. 10/443,778, Claims 1: 21–59; filed May 23, 2003 Anthony Anthony et al.
Pending specification, claims, figures for U.S. Appl. No. 10/460,361, Claims 1–16; filed Jun. 13, 2003 Anthony Anthony et al.
Pending specification, claims, figures for U.S. Appl. No. 10/705,962, Claims 1–18; filed Nov. 13, 2003 Anthony Anthony et al.
Pending specification, claims, figures for U.S. Appl. No. 10/369,335, Claims 1–20; Feb. 18, 2003 Anthony Anthony.
Pending specification, claims, figures for U.S. Appl. No. 09/647,648, Claims 1–48; filed Nov. 17, 2000 Anthony Anthony et al.
Pending specification, claims, figures for U.S. Appl. No. 10/328,942, Claims 1–20; filed Dec. 23, 2002 Anthony Anthony.
Pending specification, claims, figures for U.S. Appl. No. 09/632,048, Claims 1–20; filed Jun. 3, 2000 Anthony Anthony et al.
Pending specification, claims, figures for U.S. Appl. No. 09/996,355, Claims 1–73; filed Nov. 29, 2001 Anthony Anthony et al.
Pending specification, claims, figures for U.S. Appl. No. No. 10/023,467, Claims 1–20; filed Dec. 17, 2001 William Anthony.
Weir, et al., "DesignCon 2005, High Performance FPGA Bypass Networks" Jan. 1, 2005.
Pending claims 140 and figures (3 pages) for U.S. Appl. No. 10/399,590; the specification is contained in WO 02/33798, filed Oct. 17, 2001, which is the published version of PCT/US01/32480, which is Neifeld Reference: Apr. 25, 2002.
X2YA0015PCT–US, which is reference F–063 in the Information Disclosure Statement filed Apr. 23, 2004.
PCT International Search Report for PCT/US04/00218 Feb. 11, 2005.
PCT International Search Report for PCT/US04/14539 Feb. 16, 2005.
"Tomorrow's Capacitors," Components, 1996, No. 4, page 3.
Mason, "Valor –Understanding Common Mode Noise," Mar. 30, 1998, pages 1–7.

* cited by examiner

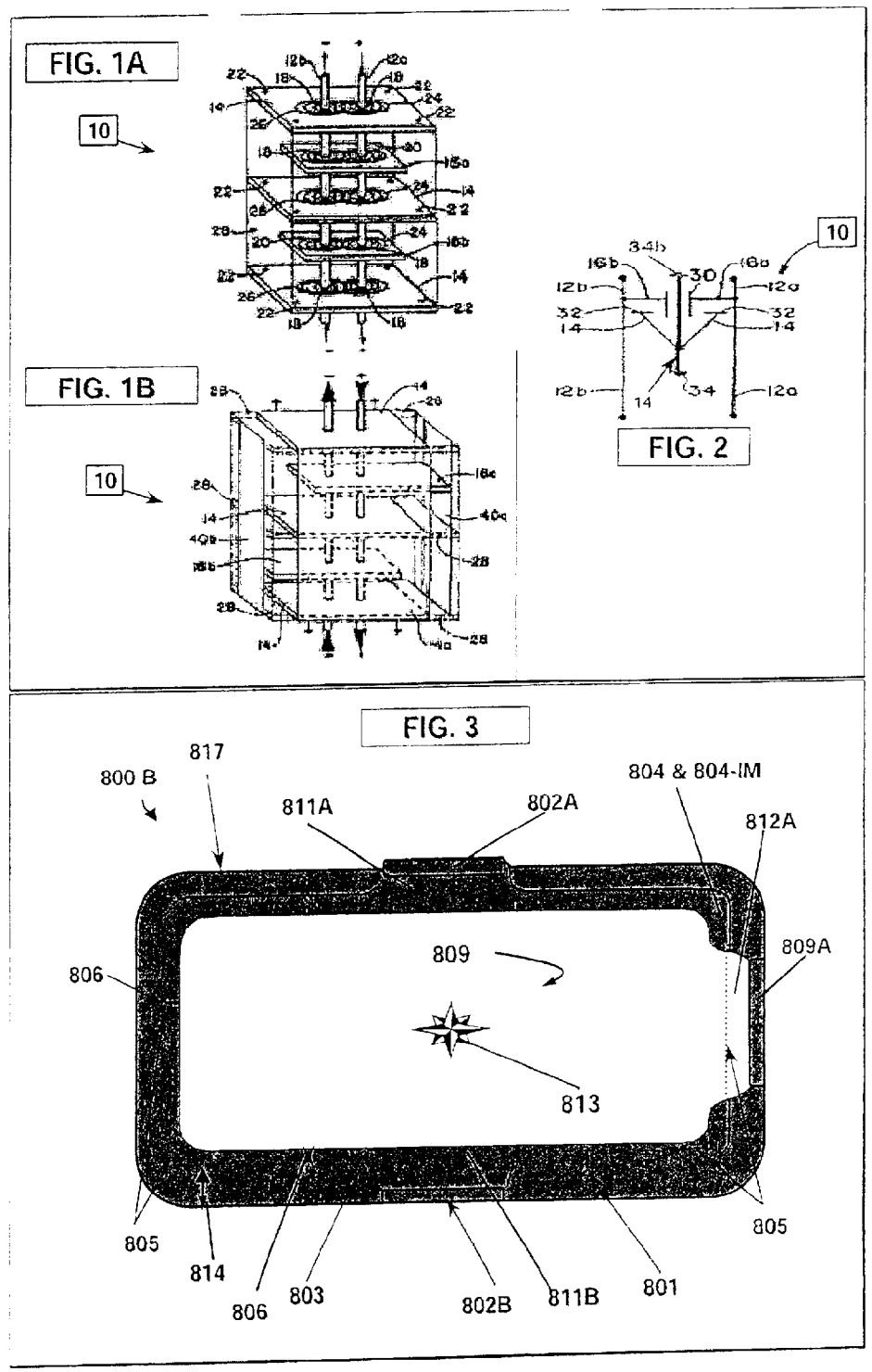

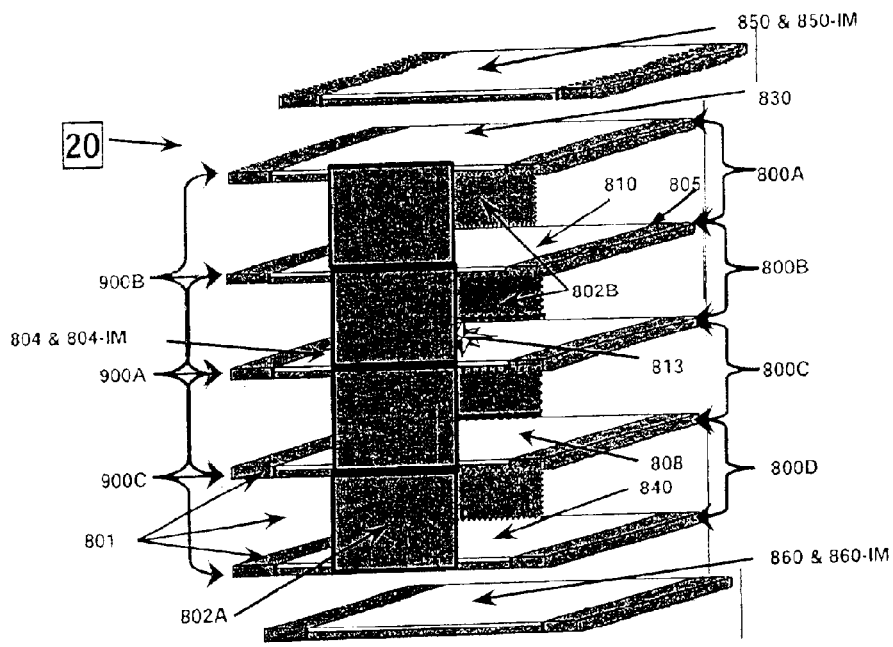
FIG. 4
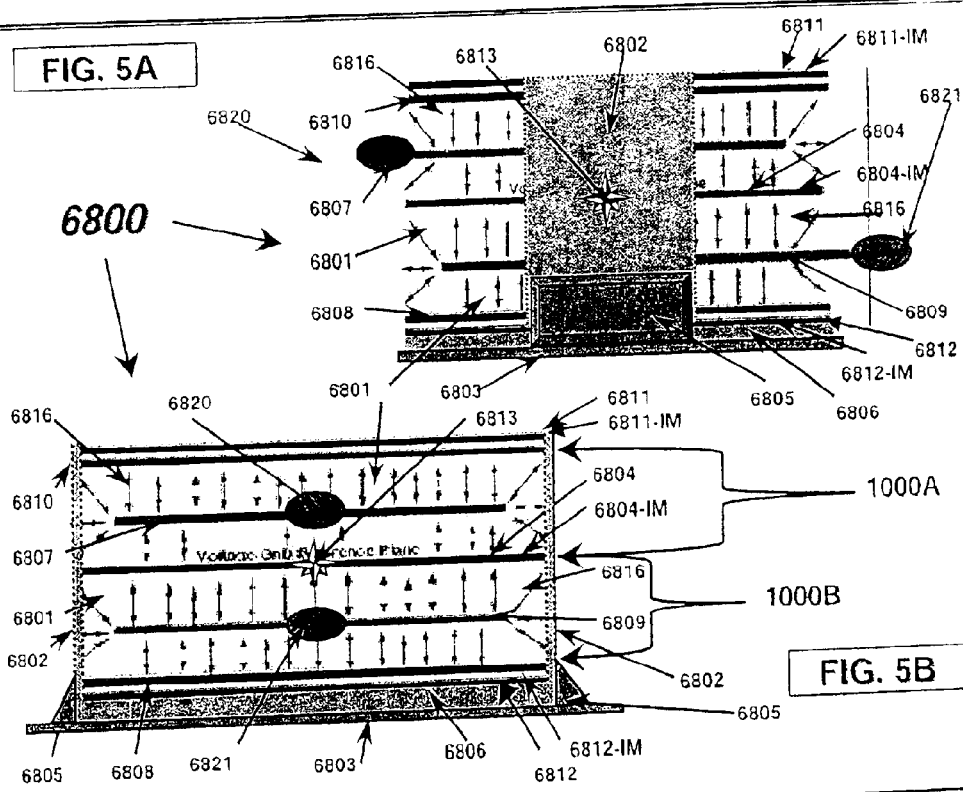
FIG. 5A
FIG. 5B

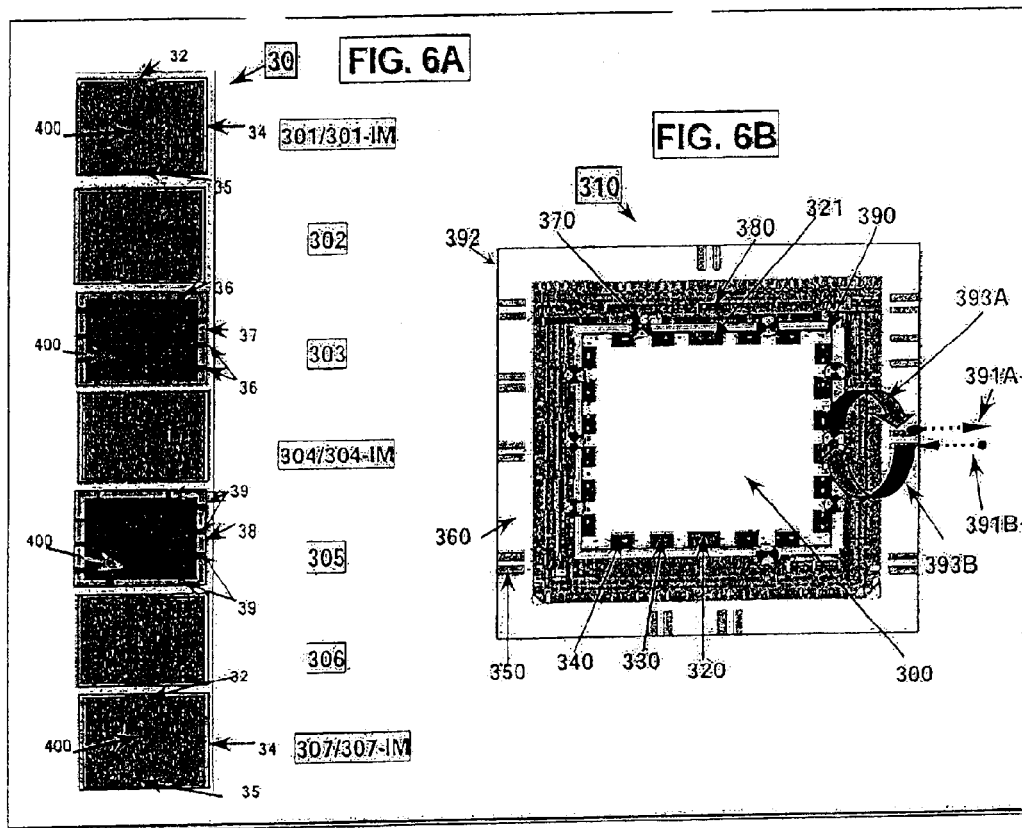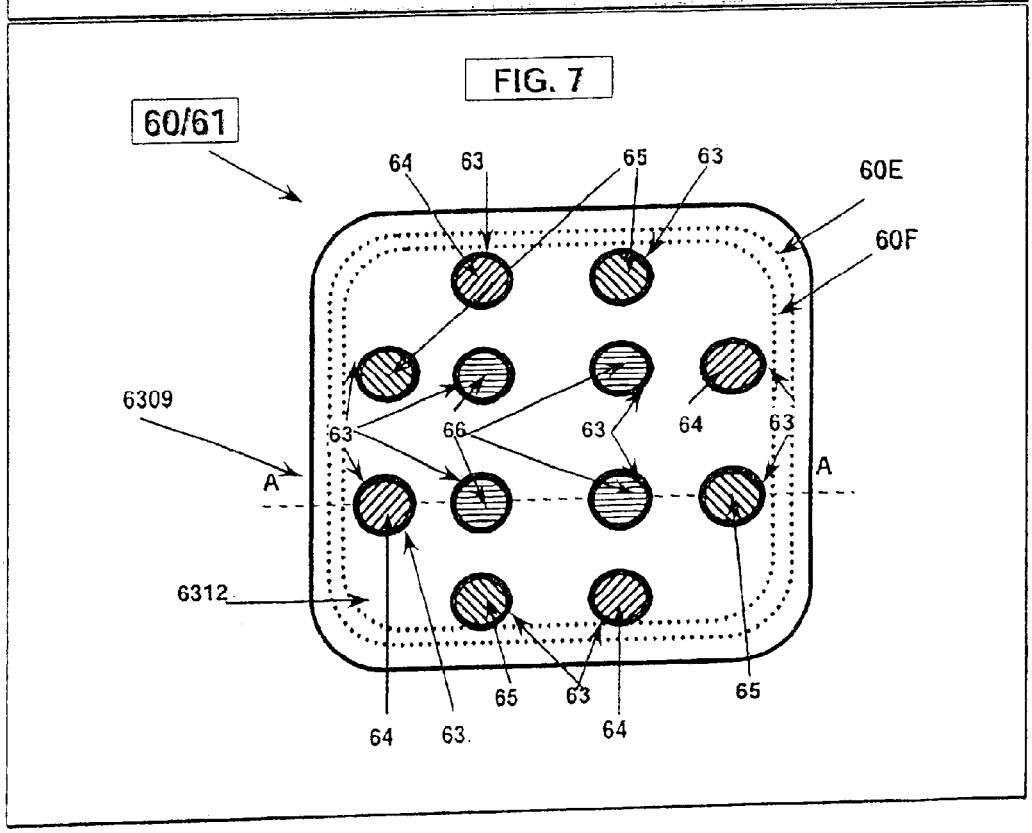

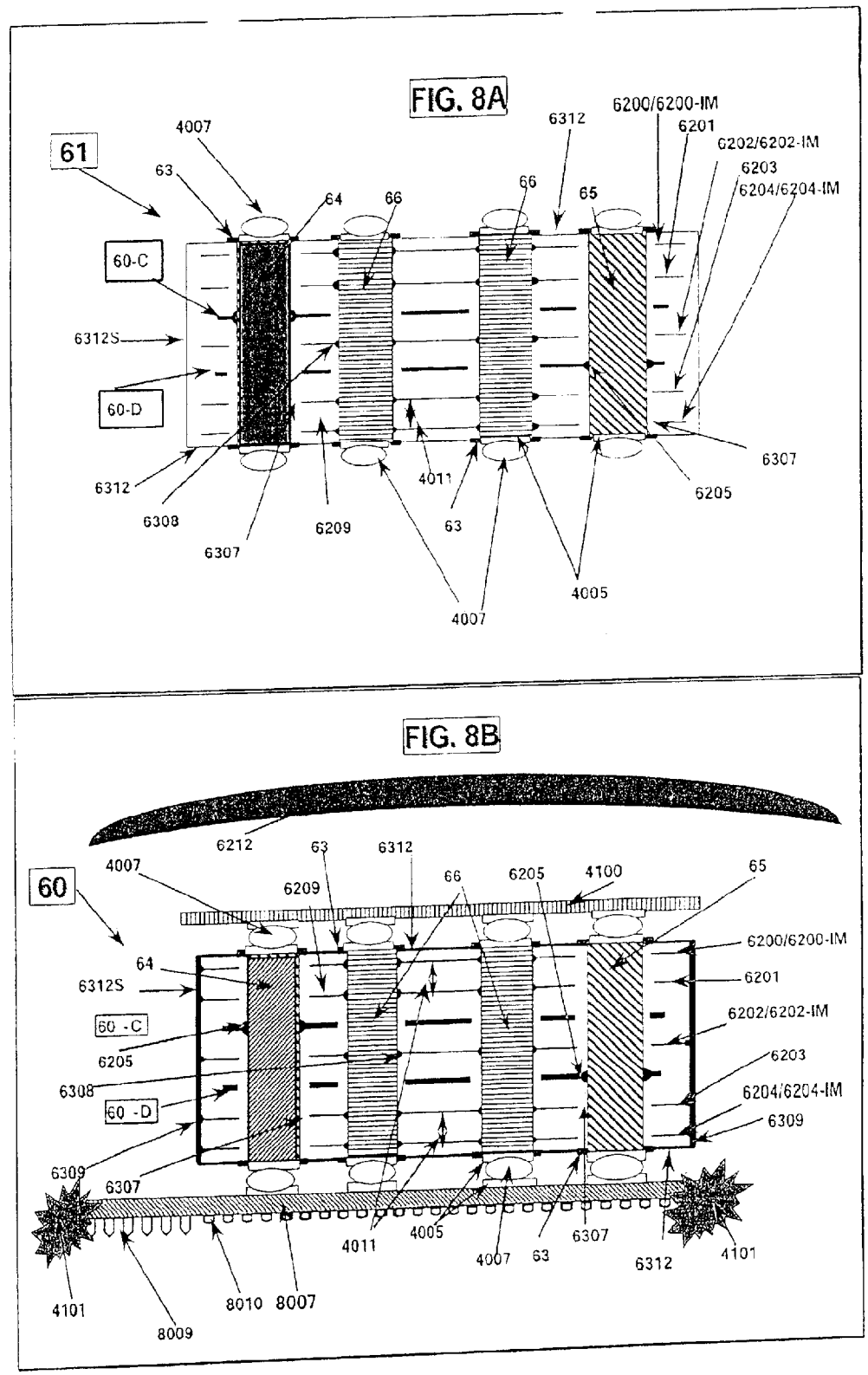

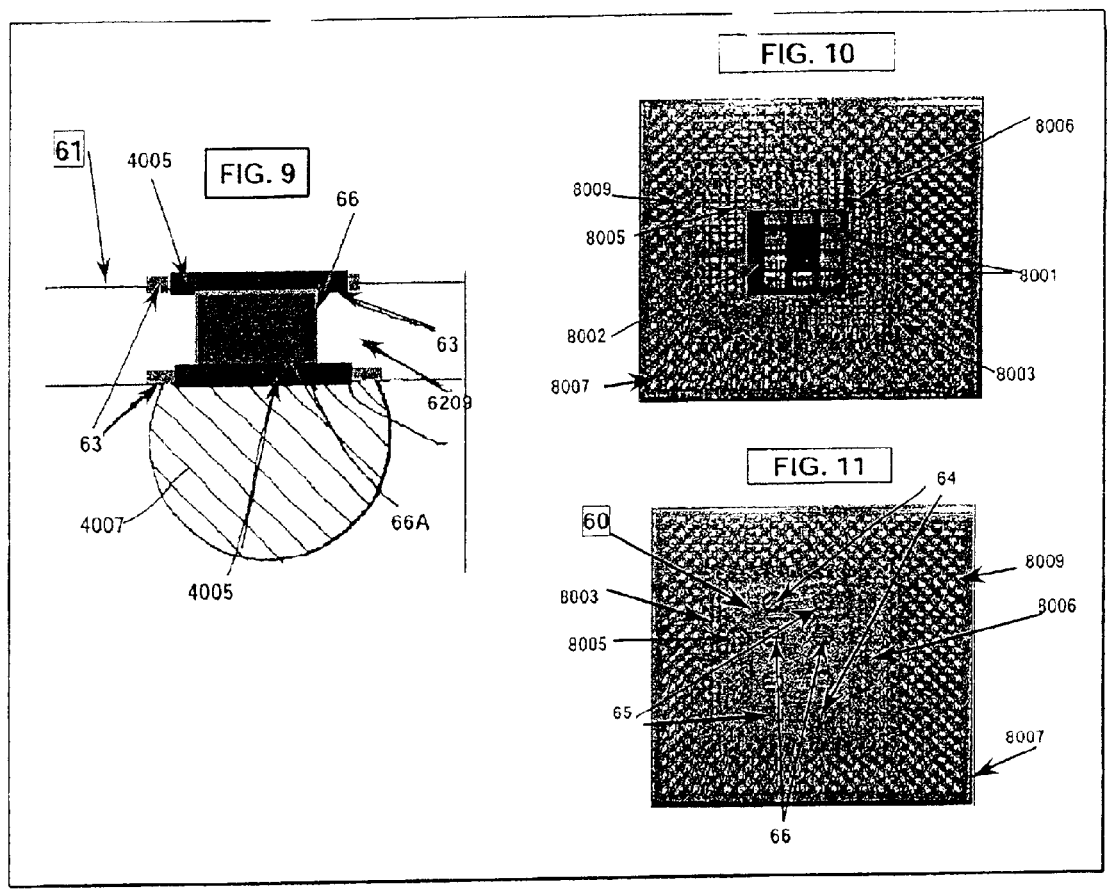

UNIVERSAL ENERGY CONDITIONING INTERPOSER WITH CIRCUIT ARCHITECTURE

This application is a continuation-in-part of application Ser. No. 09/600,530, which is a U.S. national stage application of international application PCT/US99/01040, filed Jan. 16, 1999, now issued as U.S. Pat. No. 6,498,710, and a continuation-in-part of application Ser. No. 09/632,048, filed Aug. 3, 2000, which is a continuation-in-part of co-pending application Ser. No. 09/594,447, filed Jun. 15, 2000, which is a continuation-in-part of application Ser. No. 09/579,606, filed May 26, 2000, now issued as U.S. Pat. No. 6,373,673, which is a continuation-in-part of application Ser. No. 09/460,218, filed Dec. 13, 1999, now issued as U.S. Pat. No. 6,331,926, which is a continuation of application Ser. No. 09/056,379, filed Apr. 7, 1998, now issued as U.S. Pat. No. 6,018,448, which is a continuation-in-part of application Ser. No. 09/008,769, filed Jan. 19, 1998, now issued as U.S. Pat. No. 6,097,581, which is a continuation-in-part of application Ser. No. 08/841,940, filed Apr. 8, 1997, now issued as U.S. Pat. No. 5,909,350, application Ser. No. 09/579,606 claims the benefit of U.S. Provisional Application No. 60/136,451, filed May 28, 1999, U.S. Provisional Application No. 60/139,182, filed Jun. 15, 1999, U.S. Provisional Application No. 60/146,987, filed Aug. 3, 1999, U.S. Provisional Application No. 60/165,035, filed Nov. 12, 1999, U.S. Provisional Application No. 60/180,101, filed Feb. 3, 2000, U.S. Provisional Application No. 60/185,320, filed Feb. 28, 2000, U.S. Provisional Application No. 60/200,327, filed Apr. 28, 2000, and U.S. Provisional Application No. 60/203,863, filed May 12, 2000, and application Ser. No. 09/632,048 claims the benefit of U.S. Provisional Application No. 60/191,196, filed Mar. 22, 2000 and U.S. Provisional Application No. 60/215,314, filed Jun. 30, 2000.

TECHNICAL FIELD

The present invention relates to a circuit interposer comprising a multilayer, universal, multi-functional, common conductive shield structure with conductive pathways for energy and EMI conditioning and protection that possesses a commonly shared and centrally positioned conductive pathway or electrode that simultaneously shields and allows smooth energy transfers such as decoupling operations between grouped and energized conductive pathways. The invention is for energy conditioning as it relates to integrated circuit (IC) device packaging or direct mounted IC modules, and more specifically, for interconnecting energy utilizing integrated circuit chips to a printed circuit board, (IC) device packaging or direct mounted IC modules as a interconnection medium between ICs and their component packaging and/or external energy circuit connections or other substrates containing energy pathways leading to and from an energy source and an energy utilizing load.

More specifically, the present invention allows paired or neighboring conductive pathways or electrodes to operate with respect to one another in a harmonious fashion, yet in an oppositely phased or charged manner, respectively. The invention will provide energy conditioning in such forms of EMI filtering and surge protection while maintaining apparent even or balanced voltage supply between a source and an energy utilizing-load when placed into a circuit and energized. The various embodiments of the invention will also be able to simultaneous and effectively provide energy conditioning functions that include bypassing, decoupling, energy storage, while maintaining a continued balance in SSO (Simultaneous Switching Operations) states without contributing disruptive energy parasitics back into the circuit system as the invention is passively operated within the circuit.

BACKGROUND OF THE INVENTION

Interposer structures can be used in the manufacturing process of single and multi-chip modules (SCMs or MCMs) to electrically connect one or more integrated circuit chips (ICs) to a printed circuit board, discreet IC electronic packaging, or other substrates. The interposer provides conditioning of various forms of energy propagating along the contained internal interposer conductive pathways located between an energy source and an energy-utilizing load such as an IC. The interposer can provide energy paths between the IC chips and a PC board or substrate, and if desired, between different active component chips mounted on the interposer, itself.

A main disadvantage of conventional approaches to interconnecting and packaging of IC chips in Multi Chip Modules (MCMs) arises from the thinness of the substrates used in traditional multichip modules results in the energy feeds to the IC chips having relatively high impedance. This results in undesired noise, energy loss and excess thermal energy production. These problems are relevant and can be critical to system integrity when routing or propagating energy along pathways though an interposer substrate.

Electrical systems have undergone short product life cycles over the last decade. A system built just two years ago can be considered obsolete to a third or fourth generation variation of the same application. Accordingly, passive electronic components and the circuitry built into these the systems need to evolve just as quickly. However, the evolvement of passive electronic componentry has not kept pace. The performance of a computer or other electronic systems has typically been constrained by the operating frequency of its slowest active elements. Until recently, those elements were the microprocessor and the memory components that controlled the overall system's specific functions and calculations. Nevertheless, with the advent of new generations of microprocessors, memory components and their data, the focus has changed. There is intense pressure upon the industry to provide the system user with increased processing energy and speed at a decreasing unit cost. EMI created in these environments must also be eliminated or minimized to meet international emission and/or susceptibility requirements.

Processor operating frequency (speed) is now matched by the development and deployment of ultra-fast RAM (Random Access Memory) architectures. These breakthroughs have allowed an increase of the overall system— operating frequency (speed) of the active components past the 1 GHz mark. During this same period, however, passive component technologies have failed to keep up with these new breakthroughs and have produced only incremental changes in composition and performance. These advances in passive component design and changes have focused primarily upon component size reduction, slight modifications of discrete component electrode layering, dielectric discoveries, and modifications of device manufacturing techniques or rates of production that decrease unit production cycle times.

In addition, at these higher frequencies, energy pathways should normally be grouped or paired as an electrically complementary element or elements that work together electrically and magnetically in harmony and in balance within an energized system. Attempts to line condition propagating energy with prior art components has led to increased levels of interference in the form of EMI, RFI, and capacitive and inductive parasitics. These increases are due in part to manufacturing imbalances and performance deficiencies of the passive components that create or induce interference into the associated electrical circuitry.

These problems have created a new industry focus on passive components whereas, only a few years ago, the focus was primarily on the interference created by the active components from sources and conditions such as voltage imbalances located on both sides of a common reference or ground path, spurious voltage transients from energy surges or human beings, or other electromagnetic wave generators.

At higher operating speeds, EMI can also be generated from the electrical circuit pathway itself, which makes shielding from EMI desirable. Differential and common mode noise energy can be generated and will traverse along and around cables, circuit board tracks or traces, and along almost any high-speed transmission line or bus line pathway. In many cases, one or more of these critical energy conductors can act as an antenna, hence creating energy fields that radiate from these conductors and aggravate the problem even more. Other sources of EMI interference are generated from the active silicon components as they operate or switch. These problems such as SSO are notorious causes of circuit disruptions. Other problems include unshielded and parasitic energy that freely couples upon or onto the electrical circuitry and generates significant interference at high frequencies.

U.S. patent application Ser. No. 09/561,283 filed on Apr. 28, 2000 and U.S. patent application Ser. No. 09/579,606 filed on May 26, 2000, and U.S. patent application Ser. No. 09/594,447 filed on Jun. 15, 2000 along with U.S. Provisional Application No. 60/200,327 filed Apr. 28, 2000, U.S. Provisional Application No. 60/203,863 filed May 12, 2000, and U.S. Provisional Application No. 60/215,314 filed Jun. 30, 2000 by the applicants relate to continued improvements to a family of discrete, multi-functional energy conditioners. These multi-functional energy conditioners posses a commonly shared, centrally located, conductive electrode of a structure that can simultaneously interact with energized and paired conductive pathway electrodes contained in energy-carrying conductive pathways. These energy-carrying conductive pathways can operate in an oppositely phased or charged manner with respect to each other and are separated from one another by a physical shielding.

SUMMARY OF THE INVENTION

Based upon the foregoing, there has been found a need to provide a manufactured interposed circuit connection device that uses a layered, multi-functional, common conductive shield structure containing energy-conductive pathways that share a common and centrally positioned conductive pathway or electrode as part of its structure which allows for energy conditioning as well as a multitude of other functions simultaneously in one complete unit.

The invention will also comprise at least one inclusive embodiment or embodiment variation that possesses a commonly shared and centrally positioned conductive pathway or electrode as part of its structure.

The invention will also provide for simultaneous physical and electrical shielding to portions of an active chip structure as well as for internal propagating energies within the new structure by allowing predetermined, simultaneous energy interactions to take place between grouped and energized conductive pathways to be fed by pathways external to the embodiment elements.

This application expands upon this concept and further discloses a new circuit interposer comprising a multilayer, universal multi-functional, common conductive shield structure with conductive pathways that replaces multiple, discreet versions of various prior art devices with a single individual unit that provides a cost effective system of circuit protection and conditioning that will help solve or reduce industry problems and obstacles as described above.

Accordingly, the solution to low impedance energy distribution above several hundred MHz lies in thin dielectric energy plane technology, in accordance with the present invention, which is much more effective than multiple, discrete decoupling capacitors.

It is an object of the invention to be able to provide energy decoupling for active system loads while simultaneously maintaining a constant, apparent voltage potential for that same portion of active components and its circuitry.

It is an object of the invention to minimize or suppress unwanted electromagnetic emissions resulting from differential and common mode currents flowing within electronic pathways that come under the invention influence.

It is an object of the invention to provide a wide variety of multi-layered embodiments and utilize a host of dielectric materials, unlimited by their specific physical properties that can, when attached into circuitry and energized, provide simultaneous line conditioning functions and protections as will be described.

It is an object of the invention to provide the ability to the user to solve problems or limitations not met with prior art devices which include, but are not limited to, simultaneous source to load and/or load to source decoupling, differential mode and common mode EMI filtering, containment and exclusion of certain energies such as capacitive and inductive parasitics, as well as parasitic containment and surge protection in one integrated embodiment and that performs these described abilities when utilizing a conductive area or pathway.

It is an object of the invention to be easily adapted to utilization with or without, one or more external conductive attachments to a conductive area located external to the originally manufactured invention. The external connection to a conductive area—can aid the invention embodiments in providing protection to electronic system circuitry.

It is an object of the invention to provide a physically integrated, shield-containment, conductive electrode architecture for the use with independent electrode materials and/or an independent dielectric material composition, that when manufactured, will not limit the invention to a specific form, shape, or size for the multitude of possible embodiments of the invention that can be created and is not limited to embodiments shown herein.

It is another object of the invention to provide a constant apparent voltage potential for portions of circuitry.

It is another object of the invention to provide an embodiment that utilizes standard manufacturing processes and be constructed of commonly found dielectric and conductive materials or conductively made materials to reach tight capacitive, inductive and resistive tolerances between or along electrical pathways within the embodiment, while simultaneously maintaining a constant and uninterrupted conductive pathway for energy propagating from a source to an energy utilizing load.

It is another object of this invention to provide a means of lowering circuit impedance by providing and maintaining conductive pathways that are essentially in parallel within the interposer to the energy source and the energy-utilizing load when attached into circuitry between these their energy conduits and to a circuit reference node or ground as a low circuit impedance pathway.

Lastly, it is an object of the invention to provide an embodiment that couples pairs or groups of paired electrical pathways or conductors very closely in relation to one another into an area or space partially enveloped by a plurality of commonly joined conductive electrodes, plates, or pathways, and can provide a user with a choice of selectively coupling external conductors or pathways on to separate or common conductive pathways or electrode plates located within the same embodiment.

Numerous other arrangements and configurations are also disclosed which implement and build upon the above objects and advantages of the invention in order to demonstrate the versatility arid wide spread application of a universal energy conditioning interposer with circuit architecture for energy and EMI conditioning and protection within the scope of the present invention.

BRIEF DESCRIPTION OF THE DRAWINGS

FIG. 1A shows an exploded perspective view of an embodiment from family multi-functional energy conditioners;

FIG. 1B shows an exploded perspective view of an alternate embodiment from the family multi-functional energy conditioners shown in FIG. 1A;

FIG. 2 provides a circuit schematic representation of the physical architecture from FIG. 1A and FIG. 1B when placed into a larger electrical system and energized;

FIG. 3 shows a top view of a portion of some of the non-holed embodiment elements comprising a portion of a Faraday cage-like conductive shield structure and a by-pass conductive pathway electrode;

FIG. 4 shows an exploded perspective view of a portion the non-holed embodiment elements that form a Faraday cage-like conductive shield structure that comprises a non-holed, interconnected, parallel, common conductive shield structure;

FIG. 5A shows an exploded cross-section view of a non-holed, multi-layered by-pass arrangement of the circuit architecture used in present invention configurations with outer image shields;

FIG. 5B shows a second exploded cross-sectional view of a layered by-pass as shown in FIG. 5A and rotated 90 degrees there from;

FIG. 6A shows an exploded view of a layered arrangement of an embodiment of the present invention with outer image shields;

FIG. 6B shows a partial view of the interposer arrangement depicted in FIG. 6A mounted above an Integrated Circuit Die placed into a portion of an Integrated Circuit Package that uses wireleads or pin interconnection instead of ball grid interconnections;

FIG. 7 shows a top view of an interposer arrangement;

FIG. 8A shows a cross-sectional view of an alternate interposer arrangement depicted in FIG. 7;

FIG. 8B shows a partial cross-sectional view of the interposer arrangement depicted in FIG. 7 now mounted in between an Integrated Circuit Die Integrated Circuit Package with ball grid interconnection is shown;

FIG. 9 shows a close-up view of a solder ball interconnection of FIG. 8A;

FIG. 10 shows a partial top external view of an Integrated Circuit Package showing the outline of a prior art interposer with externally mounted, discrete arrays used to assist energy conditioning;

FIG. 11 shows a partial top external view of an Integrated Circuit Package similarly depicted in FIG. 10 but with out the prior art interposer but the new invention placed between an Integrated Circuit Die Integrated Circuit Package with ball grid interconnection is shown;

DETAILED DESCRIPTION OF THE PREFERRED EMBODIMENT

As used herein, the acronym terms "UECICA" will be used to mean a universal energy conditioning interposer with circuit architecture for energy and EMI conditioning and protection within the scope of the present invention and refers to all types of discrete versions of the device.

In addition, as used herein, the acronym term "AOC" for the words "predetermined area or space of physical convergence or junction" which is defined as the physical boundary of manufactured-together invention elements. Non-energization and energization are defined as the range or degree to which electrons within the "AOC" of either discrete or non-discrete versions of UECICA are in motion and are propagating to and/or from an area located outside the pre-determined in a balanced manner.

U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350 and U.S. patent application Ser. No. 09/561,283 filed on Apr. 28, 2000, U.S. patent application Ser. No. 09/579,606 filed on May 26, 2000, and U.S. patent application Ser. No. 09/594,447 filed on Jun. 15, 2000 along with U.S. Provisional Application No. 60/215,314 filed Jun. 30, 2000 by the applicants relate to continued improvements to a family of discrete, multi-functional energy conditioners and multi-functional energy conditioning shield structures and are incorporated by reference, herein.

The new UECICA begins as a combination of electrically conductive, electrically semi-conductive, and non-conductive dielectric independent materials, layered or stacked in various structures. These layers can be combined to form a unique circuit when placed and energized in a system. The invention embodiments can include layers of electrically conductive, electrically semi-conductive, and non-conductive materials that form groups of common conductive pathway electrodes, differentially phased conductors, deposits, plates, VIAs, filled and unfilled conductive apertures that can all be referred to at one time or another, herein as meaning 'energy conductive pathway'. Herein, the term "common conductive", means the same species of energy pathway that may all be joined together in one conductive structure as a common energy pathway of low impedance as opposed to a differential conductive pathway that is usually written as with respect to another pathway that is paired up with the same in an energized circuit that would have an electrically opposite pathway functioning electromagnetically, in most cases, 180 degrees opposite our out of phase with its counterpart.

Dielectric, non-conductive and semi-conductive mediums or materials can also be referred to as simply insulators, non-pathways or simply dielectric. Some of these elements are oriented in a generally parallel relationship with respect to one another and to a predetermined pairing or groups of similar elements that can also include various combinations of conductive pathways and their layering made into a predetermined or manufactured structure. Other elements of the invention can be oriented in a generally parallel relationship with respect to one another and yet will be in a generally perpendicular relationship with other elements of the same invention.

Predetermined arrangements are used in manufacturing the invention to combine many of the elements just described such as dielectric layers, multiple electrode conductive pathways, sheets, laminates, deposits, multiple common conductive pathways, shields, sheets, laminates, or deposits, together in an interweaved arrangement of overlapping, partially overlapping and non-overlapping positions with respect to other physical structures with in the invention made up identically of the same materials yet are effected by a predetermined configuration sequence of the end manufactured result that connects specific types of these same elements such as VIAs, dielectric layers, multiple electrode conductive pathways, sheets, laminates, deposits, multiple common conductive pathways, shields, sheets, laminates, or deposits, together for final energizing into a larger electrical system in a predetermined manner.

Other conductive energy pathways can intersect and pass through the various layers just described and can be in a generally non-parallel or even perpendicular relationship with respect to these same groups of layers. Conductive and nonconductive spacers can be attached to the various groups of layers and intersecting, perpendicular pathways in a predetermined manner that allows various degrees and functions of energy conditioning to occur with portions of propagating energy passing into and out of the invention AOC.

As for all embodiments of the present invention depicted and those not pictured, the applicants contemplate a manufacturer to have the option in some cases, for combining a variety and wide range of possible materials that are selected and combined into the final make-up of the invention while still maintaining some or nearly all of the desired degrees of electrical conditioning functions of the invention after it is manufactured and placed into a circuit and energized. Materials for composition of the invention can comprise one or more layers of material elements compatible with available processing technology and is not limited to any possible dielectric material. These materials may be a semiconductor material such as silicon, germanium, gallium-arsenide, or a semi-insulating or insulating material and the like such as, but not limited to any material having a specific dielectric constant, K.

Equally so, the invention is not limited: to any possible conductive material such as magnetic, nickel-based materials, MOV-type material, ferrite material;—any substances and processes that can create conductive pathways for a conductive material such as Mylar films or printed circuit board materials; or any substances or processes that can create conductive areas such as, but not limited to, doped polysilicons, sintered polycrystallines, metals, or polysilicon silicates, polysilicon silicide. When or after the structured layer arrangement is manufactured as an interposer it is not limited to just IC packages, it can be combined with, shaped, buried within or embedded, enveloped, or inserted into various electrical packaging, other substrates, boards, electrical arrangements, electrical systems or other electrical sub-systems to perform simultaneous energy conditioning, decoupling, so to aid in modifying an electrical transmission of energy into a desired electrical form or electrical shape.

An alternative embodiment can serve as a possible system or subsystem electrical platform that contains both active and passive components along with additional circuitry, layered to provide most of the benefits described for conditioning propagated energy from a source to a load and back to a return. Some prior art interposers are already utilizing predetermined layered configurations with VIAs to service or tap the various conductive pathways or layers that lie between a dielectric or an insulating material.

The invention will also comprise at least one inclusive embodiment or embodiment variation that possesses a commonly shared and centrally positioned conductive pathway or electrode as part of its structure.

The invention will also provide for simultaneous physical and electrical shielding to portions an active chip structure as well as for internally propagating energies within the new structure by allowing predetermined, simultaneous energy interactions to take place between grouped and energized—conductive pathways to be fed by pathways external to the embodiment elements.

Existing prior art discrete decoupling capacitors lose their effectiveness at about 500 MHz. For example, mounting inductance for 0603 size capacitors has been reduced to approximately 300 pH. Assuming 200 pH for the internal capacitance of the capacitors, this equates to a total of 500 pH, which corresponds to 1.57-Ohms at 500 MHz. Accordingly, current discrete capacitors are not effective. While it is possible to use multiple components that have various values of series resonant frequencies and low ESR capacitors to drive towards low impedance at 500 MHz, the capacitance required to obtain 500 MHz with 500 pH ESL is about 200 pF. Current board materials (FR-4, 4 mils dielectric)—get 225 pF for every square inch of energy planes, which would require more than one discrete capacitor every square inch. Normally, various interposers that contain multiple discrete passive component structures offer into the circuitry a lack of electrical balance that in turn creates additional discontinuities with their presence in the energized circuit system.

A superior approach when utilizing various interconnection platforms and methodologies for direct IC chip attachment configurations to a PCB or other package connections is to provide low impedance from the energy pathways or electrode planes using a single embodiment. It is impractical to utilize many discrete, low impedancede-coupling capacitors on an interposer or PCB, if low impedance energy planes are not available to hook them up.

This application expands upon this concept and further discloses a new circuit interposer comprising a multi-layer, universal multi-functional, common conductive shield structure with conductive pathways that replaces multiple, discreet versions of various prior art components with a single individual unit that provides a cost effective, single component embodiment variations of what the applicants believe to be a new universal system of circuit protection and conditioning that will help solve or reduce industry problems and obstacles as described above with simplicity and an exponential effectiveness.

Accordingly, the solution to low impedance energy distribution above several hundred MHz lies in thin dielectric energy plane technology, in accordance with the present invention, which is much more effective than multiple, discrete decoupling capacitors.

Therefore, it is also an object of the invention to be able to operate effectively across a broad frequency range as compared to a single discrete capacitor component or a multiple passive conditioning network while maintaining a complete energy delivery protocol to a single or multiple units of active components utilizing portions of propagating energy within a circuit. Ideally, this invention can be universal in its application potentials, and by utilizing various embodiments of predetermined grouped elements, a working invention will continue to perform effectively within a system operating beyond 1 GHz of frequency.

To propagate electromagnetic interference energy, two fields are required, an electric field and a magnetic field. Electric fields couple energy into circuits through the voltage differential between two or more points. Changing electrical fields in a space give rise to a magnetic field. Any time-varying magnetic flux will give rise to an electric field. As a result, a purely electric or purely magnetic time-varying field cannot exist independent of each other. Maxwell's first equation is known as the divergence theorem based on Gauss's law. This equation applies to the accumulation of an electric charge that creates an electrostatic field, ("E-Field") and is best observed between two boundaries, conductive and nonconductive. This boundary condition behavior referenced in Gauss's law causes a conductive enclosure (also called a Faraday cage) to act as an electrostatic shield.

At a pre-determined boundary or edge, electric charges can be kept on the inside of the internally located conductive boundary of a pathway of the invention as a result of pre-determined design actions taken when the invention was built, specific manufacturing methodologies and techniques described herein account for the end product performance when placed into a circuit and energized.

Electric charges that exist outside a pre-determined boundary or edge of the internal conductive boundary of a pathway inside the invention are also excluded from effecting the very same internally generated fields trying to leave the same conductive pathways.

Maxwell's second equation illustrates that there are no magnetic charges (no monopoles), only electric charges. Electric charges are either positively charged or negatively charged. Magnetic fields are produced through the action of electric currents and fields. Electric currents and fields ("E-Field") emanate as a point source. Magnetic fields form closed loops around the current that generates fields located on along the energized conductive pathways. Maxwell's third equation, also called Faraday's Law of Induction, describes a magnetic field (H-Field) traveling in a closed loop circuit, generating current. The third equation describes the creation of electric fields from changing magnetic fields. Magnetic fields are commonly found in transformers or windings, such as electric motors, generators, and the like. Together Maxwell's third & fourth equations describe how coupled electric and magnetic fields propagate (radiate) at the speed of light. This equation also describes the concept of "skin effect," which predicts the effectiveness of magnetic shielding and can even predict the effectiveness of non-magnetic shielding.

There are two kinds of grounds normally found in today's electronics: earth-ground and circuit ground. The earth is not an equipotential surface, so earth ground potential can vary. Additionally, the earth has other electrical properties that are not conducive to its use as a return conductor in a circuit. However, circuits are often connected to earth ground for protection against shock hazards. The other kind of ground or common conductive pathway, circuit common conductive pathway, is an arbitrarily selected reference node in a circuit-the node with respect to which other node voltages in the circuit are measured. All common conductive pathway points in the circuit do not have to go to an external grounded trace on a PCB, Carrier or IC Package, but can be taken directly to the internal common conductive pathways. This leaves each current loop in the circuit free to complete itself in whatever configuration yields minimum path of least impedance for portions of energy effected in the AOC of the new invention. It can work for frequencies wherein the path of least impedance is primarily inductive.

With respect to grounding as just described above, there are at least three shielding functions that occur within the invention. First, a physical shielding of differential conductive pathways accomplished by the size of the common conductive pathways in relationship to the size of the differentially conductive pathways and by the energized, electrostatic suppression or minimization of parasitics originating from the sandwiched differential conductors as well as preventing external parasitics not original to the contained differential pathways from conversely attempting to couple on to the shielded differential pathways, sometimes referred to among others as capacitive coupling. Capacitive coupling is known as electric field ("E") coupling and this shielding function amounts to primarily shielding electrostatically against electric field parasitics. Capacitive coupling involving the passage of interfering propagating energies because of mutual or stray capacitances that originate from the differential conductor pathways is suppressed within the new invention. The invention blocks capacitive coupling by almost completely enveloping the oppositely phased conductors within Faraday cage-like conductive shield structures ('FCLS') that provide an electrostatic or Faraday shield effect and with the positioning of the layering and pre-determined layering position both vertically and horizontally (inter-mingling).

In other prior art devices, if shield coverage is not 100%, the shield structure is usually grounded to ensure that circuit-to-shield capacitances go to propagating energy reference common conductive pathway rather than act as feedback and cross-talk elements. However, the present invention can use an internal propagating energy reference common conductive pathway or an image ground within the device for this. The device's FCLS are used to suppress and prevent internal and external (with respect to the AOC) capacitive coupling between a potentially noisy conductor and a victim conductor, by an imposition of common conductive pathway layers positioned between each differential conductive pathway conductors any stray capacitance.

Secondly, a conductor positioning shielding technique which is used against inductive energy coupling and is also known as mutual inductive cancellation or minimization of portions of energy propagating along separate and opposing conductive pathways.

Finally, a physical shielding function for RF noise. Inductive coupling is magnetic field ("H") coupling, so this shielding function amounts to shielding against magnetic shields and this shielding occurs with in the device through mutual cancellation or minimization. RF shielding is the classical "metallic barrier" against all sorts of electromagnetic fields and is what most people believe shielding is about. There are two aspects to defending a circuit against inductive pickup. One aspect is to try to minimize the offensive fields at their source This is done by minimizing the area of the current loop at the source so as to promote field cancellation or minimization, as described in the section on current loops. The other aspect is to minimize the inductive pickup in the victim circuit by minimizing the area of that current loop, since, from Lenz's law; the induced voltage is proportional to this area. So the two aspects really involve the same cooperative action: minimize the areas of the current loops. In other words, minimizing the offensiveness of a circuit inherently minimizes its susceptibility. Shielding against inductive coupling means nothing more than controlling the dimensions of the current loops in the circuit. The RF current in the circuit directly relates to signal and energy distribution networks along with bypassing and decoupling.

RF currents are ultimately generated as harmonics of clock and other digital signals. Signal and propagating energy distribution networks must be as small as possible to minimize the loop area for the RF return currents. Bypassing and decoupling relate to the current draw that must occur through a propagating energy distribution network, which has by definition, a large loop area for RF return currents. In addition, it also relates to the loop areas that must be reduced, electric fields that are created by improperly contained transmission lines and excessive drive voltage.

The best way to minimize loop areas when many current loops are involved is to use a common conductive pathway. The idea behind RF shielding is that time-varying EMI fields induce currents in the shielding material. The freedom to use any material and dielectric in the construction of the assembly allows this constraint to be overcome. More formally, losses commonly referred to an absorption loss, re-radiation losses, or reflection loss, can be more controlled.

A common conductive pathway is a conducting surface that is to serve as a return conductor for all the current loops in the circuit. The invention uses its common conductive shields as an separate internal common conductive pathway located between but sandwiching the non-aperture using conductors to provide a physically tight or minimized energy loop between the interposer and the active chip that the energy is being condition for. A hole-thru, common conductive pathway-possessing structure works as well as a non-hole element of the assembly as far as for minimizing loop area is concerned. The key to attaining minimum loop areas for all the current loops together is to let the common conductive pathway currents distribute themselves around the entire area of the component's common conductive pathway area elements as freely as possible.

By surrounding predetermined conductive pathway electrodes with cage-like structures made up with one centralized and shared, common conductive pathway or area, this common pathway or area becomes a 0-reference common conductive pathway for circuit voltages and exists between at least two oppositely phased or voltage potential conductive structures which in turn are located each respectively on opposite sides of the just described sandwiched centralized and shared, common conductive pathway or area.

The addition of two additional common conductive pathways can be added to the previously disclosed five common conductive pathways into an electrically common structure that now almost completely envelopes the two differentially energized pathways as just described is a type of configuration that significantly completes the energized functions of suppressing or minimizing E-Fields and H-fields, stray capacitances, stray inductances, parasitics, and allowing for mutual cancellation or minimization of oppositely charged or phased, adjoining or abutting, electrical fields of the variously positioned propagating energy pathways. In the last step for the horizontal layering process of a 7-layer interposer, two additional common pathways sandwich the first 5-layers as previously described. A SCM or MCM, for example, built with the invention can take advantage of the various third conductive pathways common to one another or to the grounding, schemes used now by large SCM and MCM manufacturers.

In the invention, the feed path for portions of propagating energy and the return path for similar portions of propagating energy with in the invention are separated by microns of distance and normally by only by a common conductive pathway and some predetermined dielectric. Such a configuration allows for suppression or minimization and minimizes or cancels the portions of circuit energy that exists in the magnetic field and that is produced by this very tiny current loop. Maintaining a very effective mutual cancellation or minimization of inductance of opposing but shielded differential conductive pathways will effect the minimal magnetic flux remaining and means minimal susceptibility to inductive coupling, anywhere internally of the inventions elements.

The new invention mimics the functionality of an electrostatically shielded, transformer. Transformers are also widely used to provide common mode (CM) isolation. These devices depend on a differential mode transfer (DM) across their input to magnetically link the primary windings to the secondary windings in their attempt to transfer energy. As a result, CM voltage across the primary winding is rejected. One flaw that is inherent in the manufacturing of transformers is propagating energy source capacitance between the primary and secondary windings. As the frequency of the circuit increases, so does capacitive coupling; circuit isolation is now compromised. If enough parasitic capacitance exists, high frequency RF energy (fast transients, ESD, lighting, etc.) may pass through the transformer and cause an upset in the circuits on the other side of the isolation gap that received this transient event. Depending on the type and application of the transformer, a shield may be provided between the primary and secondary windings. This shield, connected to a common conductive pathway reference source, is designed to prevent against capacitive coupling between the two sets of windings.

The new invention also resembles in energy transfer or energy propagation the workings of a transformer and the new device effectively uses not just a physical shield to suppress parasitics and such, it also uses positioning of it's layering, connections of the layering, and the external combination with an external circuitry, to effectively function in a novel and unexpected way.

If a system is being upset by AC line transients, this type of function will provide the fix. In prior art devices, to be effective in this type of application; a shield must be connected to an external common conductive pathway. However, the new invention provides an alternative to this axiom.

A passive architecture, such as utilized by the invention, can be built to condition or minimize both types of energy fields that can be found in an electrical system. While the invention is not necessarily built to condition one type of field more than another, however, it is contemplated that different types of materials can be added or used to build an embodiment that could do such specific conditioning upon one energy field over another. In the invention, laying horizontal perimeter connections on the sides of the passive component element of the assembly or placement of vertical apertures through passive element, selectively coupling or not coupling these VIAS and/or conductively filled apertures, allows the passage of propagating energy transmissions to occur as if they were going a feed-through-like filtering device.

When prior art interposers are placed into a circuit and energized, their manufacturing tolerances of the devices are carried to the circuit and revealed at circuit energization.

These imbalance variables are multiplied with the addition of multiple pathways and cause voltage imbalances in the circuit.

Use of the invention will allow placement into a differentially operated circuitry and will provide a virtually electrically balanced and essentially, equal capacitance, inductive and resistance tolerances of one invention unit, that is shared and located between each paired energy pathway within the device, equally, and in a balanced electrical manner. Invention manufacturing tolerances or pathway balances between a commonly shared central conductive pathway found internally within the invention is maintained at levels that originated at the factory during manufacturing of the invention, even with the use of common non-conductive materials, dielectrics or conductive materials, which are widely and commonly specified among discrete units. Thus, an invention that is manufactured at 5% tolerance, when manufactured as described in the disclosure will also have a correlated 5% electrical tolerance between single or multiple, paired energy pathways in the invention when placed into an energized system. This means that the invention allows the use of relatively inexpensive materials, due to the nature of the architecture's minimal structure such that variation is reduced and the proper balance between energized paired pathways or differential energy pathways is obtained.

Expensive, non-commonly used, specialized, dielectric materials are no longer needed for many delicate bypass and/or energy decoupling operations in an attempt to maintain a energy conditioning balance between two system conductive pathways, as well as giving an invention users the opportunity to use a single balanced element that is homogeneous in material make up within the entire circuit. The new invention can be placed between paired or a paired plurality of energy pathways or differential conductive pathways in the invention, while the common conductive pathways that also make up the invention can be connected to a third conductive pathway or pathways that are common to all elements of the common conductive pathways internal in the invention and common to an external conductive area, if desired.

The invention will simultaneous provide energy conditioning functions that include bypassing, energy, energy line decoupling, energy storage such that the differential electrodes are enveloped within the embodiment shield structure and are free from almost all internally generated capacitive or energy parasitics trying to escape from the enveloped containment area surrounding each of the conductive pathway electrodes. At the same time, the shield structure will act to prevent any externally generated energy parasitics such as "floating capacitance" for example from coupling onto the very same differential conductive pathways due to the physical shielding and the separation of the electrostatic shield effect created by the energization of the common conductive structure and its attachment with common means know to the art to an internally or externally located conductive area or pathway.

Attachment to an external conductive area includes an industry attachment methodology that includes industry accepted materials and processes used to accomplish connections that can be applied in most cases openly without additional constraints imposed when using a different device architecture. Through other functions such as cancellation or minimization of mutually opposing conductors, the invention allows a low impedance pathway to develop within a Faraday cage-like unit with respect to the enveloping conductive common shields pathways that can subsequently continue to move energy out onto an externally located conductive area that can include, but is not limited to, a "floating', non-potential conductive area, circuit or system ground, circuit system return, chassis or PCB ground, or even an earth ground.

The various attachment schemes described herein will normally allow a "0" voltage reference to develop with respect to each pair or plurality of paired differential conductors located on opposite sides of the shared central and common conductive pathway, and be equal yet opposite for each unit of a separated paired energy pathway or structure, between the centrally positioned interposing, common conductive shield pathway used. Use of the invention allows voltage to be maintained and balanced even with multiple SSO (Simultaneous Switching Operations) states among transistor gates located within an active integrated circuit all without contributing disruptive energy parasitics back into the energized system as the invention is passively operated, within its attached circuit.

Thus, parasitics of all types are minimized from upsetting the capacitance, inductive and resistance tolerances or balance that were manufactured into the unenergized invention. The prior art has normally allowed effects from free parasitics in both directions to disrupt a circuit despite the best attempts to the contrary with all prior art devices to date.

As previously noted, propagated electromagnetic interference can be the product of both electric and magnetic fields. Until recently, emphasis in the art has been placed upon on filtering EMI from circuit or energy conductors carrying high frequency noise with DC energy or current. However, the invention is capable of conditioning energy that uses DC, AC, and AC/DC hybrid-type propagation of energy along conductive pathways found in an electrical system or test equipment. This includes use of the invention to condition energy in systems that contain many different types of energy propagation formats, in systems that contain many kinds of circuitry propagation characteristics, within the same electrical system platform.

Principals of a Faraday cage-like conductive shield like are used when the common conductive pathways are joined to one another and the grouping of these conductive pathways, together co-act with the larger, external conductive pathway, pathway area or surface that provides a greater conductive surface area in which to dissipate over voltages and surges and initiate Faraday cage-like conductive shield structure electrostatic functions of suppression or minimization of parasitics and other transients, simultaneously. When a plurality of common conductive pathways as just described are electrically coupled as either a system, circuit reference node, or chassis ground, they can be relied upon as a commonly used, reference common conductive pathway for a circuit in which the invention is placed into and energized.

One or more of a plurality of conductive or dielectric materials having different electrical characteristics from one another can be inserted and maintained between common conductive pathways and differential electrode pathways. Although a specific differential pathway can be comprised of a plurality of commonly conductive structures, they are performing differentially phased conditioning with respect to a "mate" or paired plurality of oppositely phased or charged structures that form half of the total sum of all of the manufactured differential conductive pathways contained with in the structure. The total sum of the differential pathways will also will normally be separated electrically in an even manner with equal number of pathways used simultaneously but with half the total sum of the individual differential conductive pathways approximately 180 degrees out of phase from the oppositely positioned groupings. Microns of dielectric and conductive material normally includes a predetermined type of dielectric along with a interposing and shield functioning common conductive pathway, which in almost all cases and do not physically couple to any of the differentially operating conductive pathways within the invention, itself or its AOC.

In contrast to the prior art, the new invention to provides a means of lowering circuit impedance facilitated by providing interaction of mutually opposing conductive pathways that are maintained in what is essentially, a parallel relationship, respectively within the interposer and with respect to the circuit energy source and the circuit's energy-utilizing load when attached and energized into circuitry between these their energy conduits and to a circuit reference node or common conductive pathway used as a low circuit impedance pathway by portions of propagating energy. At the same time, a entirely different group of mutually opposing conductive pathway elements can be maintained in what is essentially, a parallel relationship respectively to one another and yet be physically perpendicular to the first set of parallel mutually opposing conductive pathway elements simultaneously working in conjunction with the second set just described.

The user has options of connection to an external GnD area, an alternative common conductive return path, or simply to an internal circuit or system circuit common conductive pathway or common conductive node. In some applications, it might be desired by the user to externally attach to additional numbers of paired external conductive pathways not of the original differential conductive pathways to take advantage of the lowering of circuit impedance occurring within the invention. This low impedance path phenomenon can occur by using alternative or auxiliary circuit return pathways, as well. In this case, at energization, the various internal and simultaneous functions occurring to create a low impedance conductive pathway along the common conductive pathways internal to the new inventive structure is used by portions of energy propagating along the differential conductive pathways in essentially a parallel manner and within the interposer as it normally operates in a position, physically placed in between the various conductive pathways, running from energy source and the energy-utilizing load and back as attached into an energized circuit. Differential conductive energy pathways will be able utilize a circuit "0" Voltage reference image node or "0" Voltage common conductive pathway node created along the internal common conductive pathway in conjunction with the common conductive energy pathway shields that surround the differential conductive pathways almost completely, and coact as a joined together common conductive structure to facilitate energy propagation along the low impedance pathway, not of the differential pathways and allowing unwanted EMI or noise to move to this created pathway at energization and passive operations rather than detrimentally effecting the very circuit and portions of energy that are being conditioned in the AOC of the new interposer.

The attached plurality of internal common conductive electrode pathways that make up a Faraday cage-like conductive shield structure as part of the whole interposer invention will allow the external common conductive area or return pathway to become, in essence, an extended version of itself, internally and closely positioned in an essentially parallel arrangement only microns of distance from differentially operating conductive pathways that are them selves extensions of the external differential conductive elements with respect to their position located apart and on either side of at least one common conductive pathway that is taking on multiple shielding functions simultaneously during energization. This phenomena occurs internally in other embodiments such as, but not limited to, printed circuit boards (PCB), daughter cards, memory modules, test connectors, connectors, interposers for Single Chip Modules or Multi-Chip Modules (SCM or MCM) or other integrated circuit packages utilizing interposer interconnection at subsequent energization.

Additional objects and advantages of the invention will become apparent to those skilled in the art upon reference to the detailed description taken in conjunction with the provided figures.

Turning now to FIG. 1, an exploded perspective view of multi-functional energy conditioner 10's physical architecture is shown. Multi-functional energy conditioner 10 is comprised of a plurality of common conductive pathways 14 at least two electrode pathways 16A and 16B where each electrode pathway 16 is sandwiched between two common conductive pathways 14. At least one pair of electrical conductors 12A and 12B is disposed through insulating apertures 18 or coupling apertures 20 of the plurality of common conductive pathways 14 and electrode pathways 16A and 16B with electrical conductors 12A and 12B also being selectively connected to coupling apertures 20 of electrode pathways 16A and 16B. Common conductive pathways 14 comprise of a conductive material such as metal in a different embodiment, or in the preferred embodiment, they can have conductive material deposited onto a dielectric material or laminate (not shown) similar to processes used to manufacture conventional multi-layered chip capacitors or multi-layered chip energy conditioning elements and the like. At least one pair of insulating apertures 18 are disposed through each common conductive pathway electrode 14 to allow electrical conductors 12 to pass through while maintaining electrical isolation between common conductive pathways 14 and electrical conductors 12. The plurality of common conductive pathways 14 may optionally be equipped with fastening apertures 22 arranged in a predetermined and matching position to enable each of the plurality of common conductive pathways 14 to be coupled securely to one another through standard fastening means such as screws and bolts or in alternative embodiments (not shown) by means that allow the device to be manufactured and joined into a standard monolithic-like, multilayer embodiments similar to the processes used in the industry to manufacture prior art chip energy conditioning elements and the like. Fastening apertures 22 or even a solder attachment of common industry means and materials that can subsequently place conductive termination bands (not shown) may also be used to secure multi-functional energy conditioner 10 to another non-conductive or common conductive surface such as an enclosure or chassis of the electronic system or device the multi-functional energy conditioner 10 is being used in conjunction with.

Electrode pathways 16A and 16B are similar to common conductive pathways 14 in that they are comprised of a conductive material or in a different embodiment, can have conductive material deposited onto a dielectric laminate (not shown) or similar, that would allow the new embodiment to be manufactured and joined into a standard monolithic-like, multilayer embodiments similar to the processes used in the industry to manufacture prior art chip energy conditioning elements and the like and have electrical conductors 12A and 12B disposed through respective apertures. Unlike joined, common conductive pathways 14, electrode pathways 16A and 16B are selectively electrically connected to one of the two electrical conductors 12. While electrode pathways 16, as shown in FIG. 1, are depicted as smaller than common conductive pathways 14 this is not required but in this configuration has been done to prevent electrode pathways 16 from interfering with the physical coupling means of fastening apertures 22 or other bonding methods (not shown) and should be ideally inset within the common conductive pathways 14 and thus they posses a smaller conductive area than common conductive pathways 14.

Electrical conductors 12 provide a current path that flows in the direction indicated by the arrows positioned at either end of the electrical conductors 12 as shown in FIG. 1. Electrical conductor 12A represents an electrical propagating conveyance path and electrical conductor 12B represents the propagating energy return path. While only one pair of electrical conductors 12A and 12B is shown, Applicant contemplates multi-functional energy conditioner 10 being configured to provide filtering with a plurality of pairs of electrical conductors like 12A and 12B, as well as, electrode pathways 16A and 16B and common conductive pathways 14 which are joined together for creating a high-density multi-conductor multi-functional energy conditioner.

Another element which makes up multi-functional energy conditioner 10 is material 28 which has one or a number of electrical properties and surrounds the center common conductive pathway electrode 14, both electrode pathways 16A and 16B and the portions of electrical conductors 12A and 12B passing between the two outer common conductive pathways 14 in a manner which isolates the pathways and conductors from one another except for the connection created by the conductors 12A and 12B and coupling aperture 20. The electrical characteristics of multi-functional energy conditioner 10 are determined by the selection of material 28. If an X7R dielectric material is chosen, for example, multi-functional, energy conditioner 10 will have primarily capacitive characteristics. Material 28 may also be a metal oxide varistor material that will provide capacitive and surge protection characteristics. Other materials such as ferrites and sintered polycrystalline may be used wherein ferrite materials provide an inherent inductance along with surge protection characteristics in addition to the improved common mode noise cancellation or minimization that results from the mutual coupling cancellation or minimization effect. The sintered polycrystalline material provides conductive, dielectric, and magnetic properties. Sintered polycrystalline is described in detail in U.S. Pat. No. 5,500,629, which is herein incorporated by reference.

Still referring to FIG. 1, the physical relationship of common conductive pathways 14, electrode pathways 16A and 16B, electrical conductors 12A and 12B and material 28 will now be described in more detail. The starting point is center common conductive pathway electrode 14. Center pathway 14 has the pair of electrical conductors 12 disposed through their respective insulating apertures 18 which maintain electrical isolation between common conductive pathway electrode 14 and both electrical conductors 12A and 12B. On either side, both above and below, of center common conductive pathway electrode 14 are electrode pathways 16A and 16B each having the pair of electrical conductors 12A and 12B disposed there through. Unlike center common conductive pathway electrode 14, only one electrical conductor, 12A or 12B, is isolated from each electrode pathway, 16A or 16B, by an insulating aperture 18. One of the pair of electrical conductors, 12A or 12B, is electrically coupled to the associated electrode pathway 16A or 16B respectively through coupling aperture 20. Coupling aperture 20 interfaces with one of the pair of electrical conductors 12 through a standard connection such as a solder weld, a resistive fit or any other standard interconnect methodology to provide a solid and secure physical and electrical connection of predetermined conductive pathways. For multi-functional energy conditioner 10 to function properly, upper electrode pathway 16A must be electrically coupled to the opposite electrical conductor 12A than that to which lower electrode pathway 16B is electrically coupled, that being electrical conductor 12B. Multi-functional energy conditioner 10 optionally comprises a plurality of outer common conductive pathways 14.

These outer common conductive pathways 14 provide a significantly larger conductive common conductive pathway and/or image plane when the plurality of common conductive pathways 14 are electrically connected to an outer edge conductive band 14A by conductive termination material or attached directly by tension seating means or commonly used solder-like materials to an larger external conductive surface. 14A and 14B (not shown) that are physically separate of the differentially conductive pathways 16A and 16B and/or any plurality of electrical conductors such as 12A and 12B for example. Connection to an external conductive area helps with attenuation of radiated electromagnetic emissions and provides a greater surface area in which to dissipate over voltages and surges. Connection to an external conductive area helps electrostatic suppression or minimization of any inductive or parasitic strays that can radiate or be absorbed by differentially conductive pathways 16A and 16B and/or any plurality of differential electrical conductors such as 12A and 12B for example.

Principals of a Faraday cage-like conductive shield structure are used when the common pathways are joined to one another as described above and the grouping of common conductive pathways together coact with the larger external conductive area or surface to suppress radiated electromagnetic emissions and provide a greater conductive surface area in which to dissipate over voltages and surges and initiate Faraday cage-like conductive shield structure electrostatic functions of suppression or minimization of parasitics and other transients, simultaneously. This is particularly true when plurality of common conductive pathways 14 are electrically coupled to earth ground but are relied upon to provide an inherent common conductive pathway for a circuit in which the invention is placed into and energized with. As mentioned earlier, inserted and maintained between common conductive pathways 14 and both electrode pathways 16A and 16B is material 28 which can be one or more of a plurality of materials having different electrical characteristics.

FIG. 1A shows an alternative embodiment of multi-functional energy conditioner 10, which includes additional means of coupling electrical conductors or circuit board connections to multi-functional energy conditioner 10. Essentially, the plurality of common conductive pathways 14 are electrically connected together by the sharing of a separately located outer edge conductive band or bands 14A and/or 14B (not shown) at each conductive electrode exit and which in turn, are then joined and/or connected to the same external conductive surface (not shown) that can possess a voltage potential when the invention is placed into a portion of a larger circuit and energized. This voltage potential coacts with the external conductive surface area or areas through conductive bands 14A and/or 14B (not shown) and the internal common conductive electrodes 14 of the embodiment, as well as any of the conductive elements (shown or not shown) that are needed to utilize a connection that allows energy to propagate.

In addition, each differential electrode pathway 16A and 16B has its own outer edge conductive bands or surface, 40A and 40B respectively. To provide electrical connections between electrode pathway 16A and 16B and their respective conductive band 40A and 40B while at the same time maintaining electrical isolation between other portions of multi-functional energy conditioner 10, each electrode pathway 16 is elongated and positioned such that the elongated portion of electrode pathway 16A is directed opposite of the direction electrode pathway 16B is directed. The elongated portions of electrode pathways 16 also extend beyond the distance in which the plurality of common conductive pathways common conductive pathways 14 extend with the additional distance isolated from outer edge conductive bands 40A and 40B by additional material 28. Electrical connection between each of the bands and their associated pathways is accomplished through physical contact between each band and its associated common conductive or conductive electrode pathway, respectively.

FIG. 2 shows a quasi-schematic circuit representation of an energized portion of a circuit when the physical embodiment of multi-functional energy conditioner 10 is mated into a larger circuit and energized. Line-to-line energy conditioning element 30 is comprised of electrode pathways 16A and 16B where electrode pathway 16A is coupled to one of the pair of electrical conductors 12A with the other electrode pathway 16B being coupled to the opposite electrical conductor 12B thereby providing the two parallel pathways necessary to form a energy conditioning element. Center common conductive pathway electrode 14 is an essential element among all embodiments or connotations of the invention and when joined with the sandwiching outer two common conductive pathways 14 together act as inherent common conductive pathway 34 and 34b which depicts conductive band 14 and 14B (not shown) as connecting to a larger external conductive area 34 (not shown) and line-to-line energy conditioning element 30 and also serves as one of the two parallel pathways for each line-to-common conductive pathway energy conditioning element 32.

The second parallel pathway required for each line-to-common conductive pathway energy-conditioning element 32 is supplied by the corresponding electrode pathway 16B. By carefully referencing FIG. 1 and FIG. 2, the energy conditioning pathway relationships will become apparent. By isolating center common conductive pathway electrode 14 from each electrode pathway 16A or 16B with material 28 having electrical properties, the result is a energy conditioning network having a common mode bypass energy conditioning element 30 extending between electrical conductors 12A and 12B and line-to-common conductive pathway decoupling energy conditioning elements 32 coupled from each electrical conductor 12A and 12B to larger external conductive area 34.

The larger external conductive area 34 will be described in more detail later but for the time being it may be more intuitive to assume that it is equivalent to earth or circuit ground. The larger external conductive area 34, can be coupled with the center and the additional common conductive pathways 14 to join with said central pathway 14 to form, one or more of common conductive pathways 14 that are conductively joined and can be coupled to circuit or earth ground by common means of the art such as a soldering or mounting screws inserted through fastening apertures 22 or just laminated as a standard planar multilayered ceramic embodiment (not shown) with externally deposited conductive material like 14A and 14B which are then together coupled to the same external common conductive area or pathway (not shown) an enclosure or grounded chassis of an electrical device. While multi-functional energy conditioner 10 works equally well with inherent common conductive pathway 34 coupled to earth or circuit common conductive pathway, one advantage of multi-functional energy conditioner 10's physical architecture is that depending upon energy condition that is needed, a physical grounding connection can be unnecessary in some specific applications.

Referring again to FIG. 1 an additional feature of multi-functional energy conditioner 10 is demonstrated by clockwise and counterclockwise flux fields, 24 and 26 respectively. Maxwell's fourth equation, which is also identified as Ampere's law, states that magnetic fields arise from two sources, the first source is described as current flow in the form of a transported electrical charge and the second source is described by how the changes in electric fields traveling in a closed loop circuit will subsequently create simultaneous, magnetic fields. Of the two sources just mentioned, transported electrical charge is the description of how electric currents create magnetic fields that if the conductive source pathway and the return energy pathway are so positioned, mathematical equations can be used to describe how E & H Fields can be suppressed or minimized within the new interposer device.

To minimize RF currents within any passive component or layered structure that is being used in an energy transmission network, the concept of flux cancellation or flux minimization needs to be used. Because magnetic lines of flux travel counterclockwise within a transmission line or line conductor or layer, if we bring the RF return path parallel and adjacent to its corresponding source trace, the magnetic flux lines observed in the return path (counterclockwise field), related to the source path (clockwise field), will be in the opposing directions. When we combine a clockwise field with a counterclockwise field, a cancellation or minimization effect is observed.

If unwanted magnetic lines of flux between a source and return path are canceled or minimized, then a radiated or conducted RF current cannot exist except within the minuscule boundary of the conductive pathway inside. However, by using techniques described herein, this minuscule boundary of escaping RF energy is critical in high-speed applications and is effectively contained by the energized shield structure almost entirely enveloping the differential conductive pathway. The concept of implementing flux cancellation or minimization is simple, especially when the opposing conductors can be positioned vertically and horizontally with respect to the earth's horizon, within microns of distance to one another. The invention suppression or minimization techniques occurring simultaneous to one another during flux cancellation or minimization creates and follows convention theory as it is prescribed with the use of image planes or nodes. Regardless of how well designed a passive component is, magnetic and electric fields will normally be present to some small insignificant amount, even at speeds above 2 Gigahertz and beyond. However, if we cancel or minimize magnetic lines of flux effectively and than combine this cancellation or minimization technique with use of an image plane and shielding structures then EMI cannot exist.

To explain this concept further, the direction of the individual flux fields is determined and may be mapped by applying Ampere's Law and using the right hand rule. In doing so, an individual places their thumb parallel to and pointed in the direction of current flow through electrical conductors 12A or 12B as indicated by the arrows at either ends of the conductors. Once the thumb is pointed in the same direction as the current flow, the direction in which the remaining fingers on the person's hand curve indicates the direction of rotation for the flux fields. Because electrical conductors 12A and 12B are positioned next to one another and they can also represent a more than one current loop as found in many I/O and data line configurations, the currents entering and leaving multi-functional energy conditioner 10 oppose one another, thereby creating a closely positioned opposed flux fields 18, 20, 24, 26 which cancel or minimize each other and cancel or minimize inductance attributed to the device.

Low inductance is advantageous in modern I/O and high-speed data lines as the increased switching speeds and fast pulse rise times of modern equipment create unacceptable voltage spikes which can only be managed by low inductance surge devices and networks. It should also be evident that labor intensive aspects of using multi-functional energy conditioner 10 as compared to combining discrete components found in the prior art provides an easy and cost effective method of manufacturing. Because connections only need to be made to either ends of electrical conductors 12 to provide a line to line capacitance to the circuit that is approximately half the value of the capacitance measured for each of the line to common conductive pathway capacitance also developed internally within the embodiment. This provides flexibility for the user as well as providing a potential savings in time and space in manufacturing a larger electrical system utilizing the invention.

A portion of a Faraday-cage-like common conductive shield structure found in the present invention is shown in detail in FIG. 3 and in FIG. 4. Accordingly, discussion will move freely between FIG. 3 and FIG. 4 to disclose the importance that a Faraday-cage-like common conductive shield structure plays in combination with various external common conductive pathways. FIG. 3 shows a portion 800B, which comprises a portion of the complete Faraday cage-like conductive shield structure 20 as shown in FIG. 4.

In FIG. 3, differential conductive by-pass electrode pathway 809 is sandwiched between the shared, central common conductive pathway 804/804-IM of structure 20 and common conductive pathway 810 (not shown in FIG. 3), which is seated above pathway 809 in depiction FIG. 4. Positioned above and below by-pass pathway 809 is a dielectric material or medium 801. Common conductive pathways 804/804-IM and 810, as well as pathway 809, are all separated from each other for the most part by a general parallel interposition of a predetermined dielectric material or medium 801, which is placed or deposited during the manufacturing process between each of said conductive pathway applications. All of the conductive common conductive pathways 860/860-IM, 840, 804/804-IM, 810, 830, and 850/850-IM are offset a pre-determined distance 814 from the outer edge of embodiment 800B. In addition, all of the differential conductive pathways 809 are offset an additional distance 806 from the outer edge of embodiment 800B such that the outer edge 803 of differential conductive pathway 809 is overlapped by the edge 805 of the common conductive pathways. Accordingly, differential conductive pathway 809 comprises a conductive area that will always be less than any of one conductive area of any given said common conductive pathways' conductive area when calculating its' total conductive area. The common conductive pathways will generally all possess nearly the same as manufacturability controllable conductive area that is homogenous in area size to on another as well in general make-up. Thus, any one of the sandwiching common conductive pathway's will posses a total top and bottom conductive area sum always greater than the total conductive area top and bottom summed of any one differential conductive pathway and will always be almost completely physically shielded by the conductive area of any common conductive pathway of Faraday-cage-like common conductive shield structure.

Looking at FIG. 4, it is seen that common pathways 860/860-IM, 840, 804/804-IM, 810, 830, and 850/850-IM are also surrounded by dielectric material 801 that provides support and outer casing of the interposer component. Conductive connection material or structures 802A and 802B are applied to a portion of said common shield pathway structures edges 805 of said common pathways of a structure 20 on at least two sides as is depicted in FIG. 4 and as is depicted for 804/804-IM in FIG. 3. This enables the electrical conditioning functions to operate properly in this type of embodiment. A break down of structure 20 into even smaller, paired, cage-like conductive structure portions reveals for example conductive structure 900A which is further comprised of common conductive pathways 804/804-IM, 808 and 810, individually, and now together, with common conductive material connections 802A and 802B that will form a single, common conductive, center structure 900A of larger structure 20 that would alone, operate sufficiently as one common conductive cage-like structure of 900A, if built as such, individually and connected in a similar manner into a circuit.

To condition additional differential conductive pathways (not shown), as part of a larger stacking of a interposer utilizing common conductive pathway electrodes could be added in a pre-determined fashion, for by-pass as shown in FIG. 3 or for a feed-thru configuration, not shown, but disclosed in pending applications referenced herein. All that is needed for proper device functions, as long as conductive connection material connections 802A and 802B maintain physical and electrical contact with some portion of common pathways edge electrodes 805 of each, respective, common conductive pathways and as long as each and every differential pathway is sandwiched by at least two common conductive pathways and said differential conductive pathways are set-back in a generally equal 806 positioning so that the stacked yet separated differential electrodes, each embodiment may operate the units minimization and suppression functions in a balanced manner with respect to conductive material areas as just discussed.

Returning to FIG. 4, paired, differential energy propagation shielded container comprising conductive pathways similar to 809 and 818 (not shown) in FIG. 3 will utilize conductive connection material or structures 802A and 802B that comprises a conductive material generally known and used in the art to electrically connect conductive pathways to one another in a typical circuit system as can be done using prior art methodologies.

Before embodiment 20 of FIG. 4 is placed into circuitry and energized, structures 802A and 802B should electrically connect conductive pathways to one another in a typical circuit system and provide externally located conductive pathways or areas (not shown) or same external conductive paths (not shown) a good electrical connection without any conductive interruption or gap between each respective conductive structures 802A and 802B.

In FIG. 3, single cage-like structure 800B mirrors single cage-like structure 800C except that differential electrode 818 (not shown) contained within, and exit/entrance sections 812A and 812B (not shown) as well as conductive pathway extension structures 812A and 812B (not shown), are positioned in a generally opposite placement position relative to one another or its paired mate in multi-paired applications, and will operate in an electrically balanced manner with one another conductive pathway differential electrode of conductive structure 809B (not shown) with exit/entrance section 812B (not shown) that can be in a generally opposing direction, approx. 180 degrees to that of conductive pathway differential electrode of conductive structure 809A with exit/entrance section 812A. Differential structures contained within these two commonly conductive, cage-like structures or common containers 800C and 800B are in a positioned and electrically parallel relationship, but most importantly, structures 800C and 800B comprising structure 900A are sharing the same, central common conductive shared pathway 804/804-IM, that makes up part of each smaller cage-like structures, 800C and 800B, when taken individually. Together, 800C and 800B create a single and larger conductive Faraday-cage-like common conductive shield structure 900A that acts as a double or paired shielded common conductive pathway container.

Each container 800C and 800B can hold an equal number of same sized, differential electrodes that are not necessarily physically opposing one another within larger structure 900A, yet are oriented in a generally physically and electrically parallel manner, respectively. Larger, conductive faraday-cage-like common conductive shield structure 900A with co-acting 800C and 800B individual shield-like structures, when energized, and attached to the same external common conductive path area by common conductive material connections 802A and 802B by any possible means of commonly acceptable industry attachment methods such as reflux solder conductive epoxies and adhesives and the like (but not shown), become one electrically, at energization.

The predetermined arrangements of the common conductive electrodes are shown in FIG. 4, with common conductive electrode 810 and 808 with a centralized common shield 804/804-IM connected by common conductive material connections 802A and 802B to an external common conductive pathway or area are some of the elements that make up one common conductive cage-like structure 900A. Common conductive cage-like 800B is an element of the present invention, namely the energy conditioning interposer with circuit architecture.

The central common conductive shared pathway 804/804-IM with respect to its interposition between the differential electrodes 809 and 818 (not shown) needs the outer two additional sandwiching common electrode pathways 808 and 810 to be considered an un-energized, Faraday cage-like conductive shield structure 900A. To go further, the central common pathway 804/804-IM will be used simultaneously by both differential electrodes 809 and 818, at the same time, but with opposite results with respect to charge switching.

The following sections that reference to common conductive pathway 804/804-IM, also apply to common conductive pathways 808 and 810. Common conductive pathway 804/804-IM is offset a distance 814 from the edge of the invention. One or more portions 811A and 811B of the common conductive pathway electrode 804/804-IM extends through material 801 and is attached to common conductive band or conductive material structures 802A and 802B. Although not shown, common 802A and 802B electrically connects common conductive pathways 804/804-IM, 808 and 810 to each other and to all other common conductive pathways (860/860-IM, 840, 830, and 860/860-IM) if used.

This offset distance and area 806 of FIG. 3, enables the common conductive pathway 804/804-IM to extend beyond the electrode pathway 809 to provide a shield against portions of energy flux fields (not shown) which might have normally attempted to extend beyond the edge 803 of the electrode pathway 809 but were it not for the electrostatic shielding effect of an energized faraday-like cage systems resulting in reduction or minimization of near field coupling between other internal electrode pathways such as 818 (not shown) or to external differential electrode pathways elements. The horizontal offset 806 can be stated as approximately 0 to 20+ times the vertical distance 806 between the electrode pathway 809 and the common conductive pathway 804/804-IM. The offset distance 806 can be optimized for a particular application, but all distances of overlap 806 among each respective pathway is ideally, approximately the same, as manufacturing tolerances will allow. Minor size differences are unimportant in distance and area 806 between pathways as long as electrostatic shielding function (not shown) of structure 900A or structure 20 is not compromised.

In order to connect electrode 809 to energy pathways positioned external to 809, yet on either side of the 800B, respectively (not shown), the electrode 809 may have one, or a plurality of, portions 812 which extend beyond the edge 805 of the common conductive pathways 804/804-IM and 808 to a connection area 812A and 812B which are in turn conductively connected to conductive pathway material, deposit or electrode 809A and 809B, which enables the by-pass electrode 809 to be electrically connected to the energy pathways (not shown) on either side. It should be noted that element 813 is a dynamic representation of the center axis point of the three-dimensional energy conditioning functions that take place within the interposer invention (not shown) and is relative with respect to the final size, shape and position of the embodiment in an energized circuit.

Referring now to FIG. 4, the concept of the universal, multi-functional, common conductive shield structure (for use with the applicants discreet, non-interposer energy conditioners) is shown. The universal, multi-functional, common conductive shield structure 20 comprises multiple, stacked, common conductive cage-like structures 900A, 900B and 900C as depicted and which in turn are comprised of multiple, stacked, common conductive cage-like structures or containers 800A, 800B, 800C, and 800D (each referred to generally as 800X), in a generally parallel relationship. Each common conductive cage like structure 800X comprises at least two common conductive pathway electrodes, 830, 810, 804/804-IM, 808, or 840. The number of stacked, common conductive cage-like structures 800X is not limited to the number shown herein, and can be any even integer. Thus the number of stacked, common conductive cage-like structures 900X is also not limited to the number shown herein and could be of an even or odd integer. Although not shown, in other applications, each paired common conductive cage-like structure 800X sandwiches at least one conductive pathway electrode as previously described in relation to FIG. 3. The common conductive cage-like structures 800X are shown separately to emphasize the fact they are paired together and that any type of paired conductive pathways can be inserted within the respective common conductive cage like structures 800X. As such, the common conductive cage-like structures 800X have a universal application when paired together to create larger common conductive cage-like structures 900X, which are delineated as 900B, 900A and 900C, respectively and can be used in combination with paired conductive pathways in discrete, or non-discrete configurations such as, but not limited to, embedded within silicone or as part of a PCB, discreet component networks, and the like.

The common conductive pathway electrodes 830, 810, 804/804-IM, 808, 840, are all conductively interconnected as shown at 802A and 802B(s) which provide connection point(s) to an external conductive area (not shown). Each common conductive pathway electrode 830, 810, 804/804-IM, 808, 840, is formed on dielectric material 801 to edge 805 and reveal opposite side bands also comprised of dielectric material 801.

As has described in FIG. 3, the dielectric material 801, conductively separates the individual common conductive pathway electrodes 830, 810, 804/804-IM, 808, 840, from the conductive pathway electrodes (not shown) sandwiched therein. In addition, as described in relation to FIG. 3, a minimum of two cages, for example 800B and 800C, which make up larger cage 900A, are required to make up a multi-functional line-conditioning structure for use in all of the layered embodiments of the present invention. Accordingly, there are a minimum of two required common conductive cage like structures 800X, as represented in FIG. 4 per each 900A, 900B, and 900C, respectively. No matter the amount of shield layers used or the processes that derive the final form are arrived at, the very basic common conductive pathway manufacturing result of any sequence (excluding dielectric materials, etc.) should appear as an embodiment structure that is as follows: a first common conductive pathway, then a conductive pathway (not shown), then a second common conductive pathway, second conductive pathway (not shown) and a third common conductive pathway. The second common conductive pathway in the preceding results becomes the centrally positioned element of the result. For additional layering of pathways desired, additional results of a manufacturing sequence would yield as follows for example, a third conductive pathway (not shown), than a fourth common conductive pathway, a fourth conductive pathway (not shown); than a fifth common conductive pathway. If an image shield configuration is desired to be used as is shown in FIG. 4 as pathways 850/850-IM and 860/860-IM there is no difference in the first layer result other than a last set of sandwiching common conductive pathways 850/850-IM and 860/860-IM are added. Again as a result of almost any manufacturing sequence as follows: (excluding dielectric material, etc.) 860/860-IM common conductive pathway is placed, than a first common conductive pathway, then a conductive pathway (not shown), then a second common conductive pathway, second conductive pathway (not shown) and a third common conductive pathway a third conductive pathway (not shown), than a fourth common conductive pathway, a fourth conductive pathway (not shown); than a fifth common conductive pathway, finally a 850/850-IM common conductive pathway will be the resulting structure for this example in FIG. 4. In summary, most chip, non-hole thru embodiments of the applicants discreet, non-interposer energy conditioners will have a minimum of two electrodes 809 and 809' (not shown) sandwiched between three common conductive electrodes 808 (not shown) and 804/804-IM and 810 (not shown), respectively, and a minimum of two electrodes 809 and 809' (not shown) connect to external structures 809A and 809A' (not shown). Three common conductive electrodes 808 (not shown) and 804/804-IM and 810 (not shown), respectively and connected external structures 802A and 802B are connected such that they are conductively considered as one to form a single, larger Faraday-cage-like structure 900A. Thus when a single, larger Faraday-cage-like structure 900A is attached to a larger external conductive area (not shown), the combination helps perform simultaneously, energized line conditioning and filtering functions upon the energy propagating along the conductors 809 and 809' (not shown), sandwiched within the cage-like structure 900A, in an oppositely phased or charged manner. Connection of the joined common conductive and enveloping, multiple common shield pathways 808 (not shown) and 810 (not shown), respectively with a common centrally located common conductive pathway 804/804-IM will become like the extension of external conductive element 6803, as shown in FIG. 5B and will be interposed in such a multiple parallel manner that said common conductive elements will have microns of distance separation or 'loop area' with respect to the complimentary, phased differential electrodes that are sandwiched themselves and yet are separated from the extension of external conductive element like 6803, shown in FIG. 5B by a distance containing a dielectric medium.

This enables the extension of external conductive element like 6803, shown in FIG. 5B to perform electrostatic shielding functions, among others, that the energized combination as just described will enhance and produce efficient, simultaneous conditioning upon the energy propagating on or along said portions of assembly 900A's differential conductors 809 and 809" (not shown). The internal and external parallel arrangement groupings of a combined common conductive 900A will also cancel or suppress unwanted parasitics and electromagnetic emissions that can escape from or enter upon portions of said differential conductors differential conductors 809 and 809' (not shown) used by said portions of energy as it propagates along a conductive pathways (not shown) to active assembly load(s), which is explained further, below with FIG. 5A.

Referring now to FIGS. 5A and 5B, a further embodiment of the layered, universal, multi-functional common conductive shield structure of the present invention is shown in a by-pass configuration 6800 hereinafter referred to as "by-pass shield structure". By-pass shield structure 6800 could also take on a configuration of 'feed-thru shield structure" 6800 in terms of relative stacking position of a static embodiment of each. There would be relatively no difference between these two possible configurations when inspecting the positioning of stacked two common conductive shield structures 1000A and 1000B or of common conductive pathways 6808, 6810, 6811, 6812 and central common shared conductive pathway 6804 that could make up each embodiment. While appearing physically similar in arrangement "feed-thru shield structure" 6800 and 'by-pass shield structure" 6800, each would still yield the same possible functional contribution to the energy conditioning of a circuit. However, the way to which the non-common pathways 6809 and 6807 are constructed and subsequently positioned with respect to circuit pathway attachments would also determine the final type of energy conditioning results that could be expected in the circuit. Whatever configuration, the various shielding functions, physical and electrical, work about the same way with respect to propagated energy (not shown) in the AOC of By-pass shield structure 6800.

Referring specifically to FIG. 5A, the by-pass shield structure 6800 is shown in cross section extending longitudinally and comprises a seven layer common conductive pathway stacking of two common conductive shield structures 1000A and 1000B, which form the present embodiment of the by-pass shield structure 6800. In FIG. 5B, the by-pass shield structure 6800 is shown in cross section perpendicular to the cross section shown in FIG. 5A.

Referring to both FIGS. 5A and 5B, the by-pass shield structure 6800 comprises a central common conductive shared pathway 6804 that is connected with elements 6808, 6810, 6811, 6812 and energized and will form a zero voltage reference to circuitry (not shown) with the creation of 6804-IM, 6811-IM and 6812-IM which is formed and relative only to the active circuit elements attached commonly (not shown), but not before connection of the 6802A and 6802B (s) by connection means 6805 to external conductive surface 6803. With energization, the circuitry (not shown) will include a passively operating universal, multi-functional, common conductive shield structure 6800 that will be used by energy source (not shown) and energy-utilizing load (s) with propagated energy in a balanced manner that will be available when energized active components (not shown) in said circuitry (not shown) demand portions of said energy. Elements as just described including portions of all of the common conductive elements in the chain of connections to 6803 as just described will have created for said energized circuit elements 6807, 6820, 6809, 6821, a zero voltage reference, 6811-IM, 6804-IM, 6812-IM respectively, and with central common conductive shared pathway 6804, electrically balance coupled energy within the circuit (not shown) with the formation of a third but common electrical node, separate of the two distinct and separate differential nodes utilized by differential conductive pathways 6809 and 6807 and their respective conductively linking elements 6820 and 6821.

In order to couple by-pass shield structure 6800 to an energized circuit, differential conductive pathways 6807 and 6809, respectively, are each inserted into one of the two common conductive shield structures. The first common conductive shield structure 1000A is formed between common conductive pathway 6810 and central common conductive shared pathway 6804. The second common conductive shield structure 1000B is formed between common conductive pathway 6808 and central common conductive-shared pathway 6804. To use by-pass shield structure 6800 a first differential conductive pathway 6807 is placed within the first common conductive shield structure and separated from the common conductive pathway 6810 and the central common conductive-shared pathway 6804 by a dielectric material 6801. The dielectric material 6801 separates and electrically isolates the first differential conductive pathway 6807 from the first common conductive shield structure. In addition, a second differential conductive pathway 6809 is placed within the second common conductive shield structure and separated from the common conductive pathway 6808 and the central common conductive-shared pathway 6804 by a dielectric material 6801.

The first and second differential conductive pathways 6807 and 6809, respectively, are then electrically connected to external conductive energy pathways 6820 and 6821, respectively. The electrical connections can be made by any means known to a person of ordinary skill in the art, including but not limited to solder, resistive fit sockets, and conductive adhesives. Completing the by-pass shield structure 6800 are the additional outer shield structures 6811 and 6812, which sandwich both common conductive shield structures 1000A and 1000B with dielectric material 6801 interposed between. Each of the outer common conductive shields 6811 and 6812 form image structures 6811-IM and 6812-IM as just described, when energized, that includes an outer conductive portion of shields 6811 and 6812 (not shown) and the outer conductive portions of external common conductive electrode structure(s) 6802A and 6802B that forms a relatively large skin area and a zero voltage reference with 6804-IM by external common conductive structure 6803. The outer skin surface formed by the combination of the external common conductive electrode structure 6802A and 6802B and the outer shield image structures 6811-M and 6812-M absorbs energy when the circuit is energized and than act as an additional enveloping shield structure with respect to 6809 and 6807 differential conductive pathways. If the by-pass shield structure 6800 is attached to an external common conductive pathway 6803 of an energy conditioning circuit assembly ('ECCA') by known means 6805, such as solder material, portions of energy will travel along the created low impedance pathway that exists internally, with common conductive structure elements 6812, 6808, 6804, 6810, 6811 6802A and 6802B, and the external connection 6805 to third conductive pathway 6803 and be able to return by this pathway 6803 to its source.

The external common conductive electrode structure(s) 6802A and 6802B are connected to electrical circuits by means known in the art and therefore the present invention is not limited to discreet structures but could, for example, be formed in silicon within an integrated circuit. In operation, by-pass shield structure 6800 and the two common conductive shield structures 1000A and 1000B, effectively enlarge the zero voltage reference 6804-IM, 6811-IM and 6812-IM within the area of convergence AOC 6813. The AOC 6813 is the energy central balance point of the circuit.

The result of the by-pass shield structure 6800 when energized within a circuit is increased physical shielding from externally generated and internally propagating parasitics 6816 (represented by the double sided arrows) as well as providing lower impedance paths generated along the common conductive pathway electrode 6812, 6808, 6804, 6810, 6811 6802A and 6802B, surfaces to external conductive pathway 6803. The electrostatic functions (not shown) occur in an energized state to energy parasitics 6816, which are also representative of portions of externally and internally originating energy parasitics 6816 that would otherwise disrupt portion of propagated energy. The double-sided arrows show how the charged electron exchange representative of the electrostatic functions that occur in an energized state to trap parasitics 6816 within a shielded container. The double-sided arrows also represent the simultaneous, but opposite charge affect that occurs along the 'skins' of the conductive material that is located within each respective container.

Turning now to FIG. 6A, a layering sequence of a surface mount energy conditioning interposer 30 with circuit architecture is shown. Interposer 30 comprises a minimum of two differential conductive pathways 303, 305. Interposer 30 also comprises a minimum of three common conductive pathway layers 302, 304, 306, which are electrically interconnected and surround the differential conductive pathways 303, 305, both above and below, to form a large Faraday cage-like common conductive shield structure about each paired differential pathways, as has been previously disclosed. In one embodiment, interposer 30 also comprises an additional common conductive pathway layer 301/301-IM, 307/307-IM, or image shield layer, stacked on the outer common conductive pathway layers 302 and 306. These image shield layers 301/301-IM, 307/307-IM are also electrically interconnected to the other common conductive pathway layers 302, 304, and 306. The centrally positioned common conductive pathway 304 separates differential conductive pathways 303, and 305. Common conductive pathway 304 is shared such that it forms a portion of a Faraday cage-like conductive shield structure surrounding both the first and second differential conductive pathways 303 and 305.

Each common conductive pathway layer 301/301-IM, 302, 304, 306, 307/307-IM comprises a conductive electrode material 400 deposited in a layer surrounded on at least a portion of a perimeter thereof by an insulation band 34. Insulation band 34 is made of a non-conductive material or dielectric material. Protruding through the insulation bands 34 on the perimeter of each common conductive pathway layer 301/301-IM, 302, 304, 306, 307/307-IM are electrode extensions 32, 35 which facilitate connections between the common conductive pathways and I/O of various IC chips (not shown) in addition to other external connections to common conductive pathways or other shields. Similarly, first and second differential conductive layers 303, 305 comprise a conductive electrode material 400 deposited in a layer surrounded on at least a portion of a perimeter thereof by an insulation band 37 and 38, respectively. Insulation bands 37 and 38 are made of a non-conductive material, dielectric material, or even can be simply an absence of conductive material on the same layer of material that the conductive material resides upon. It should be noted that insulation bands 37 and 38 are generally wider than insulation band 34 of the common conductive pathway layers 301/301-IM, 302, 304, 306, 307/307-IM such that there is an overlap or extension of the common conductive pathway layers beyond the edge of the first and second differential conductive pathways as has been previously discussed. First and second differential conductive layers 303, 305 include multiple location electrode extensions 36 and 39, respectively, which facilitate connections to the internal integrated circuit traces and loads in addition to connections to the external energy source and/or lead frame.

As with previous embodiments, the layers 301/301-IM, 302, 303, 304, 305, 306, and 307/307-IM are stacked over top of each other and sandwiched in a parallel relationship with respect to each other. Each layer is separated from the layer above and below by a dielectric material (not shown) to form energy conditioning interposer 30.

In FIG. 6B, an integrated circuit 380 is shown mounted in a carrier, in the form of an IC or DSP package 310 configured with connected wire pin outs (not shown). As generally indicated at 300, an integrated circuit die is placed within IC package 310 with one section removed and exposed for viewing of the internal and external interconnections features displaying the finished energy conditioning interposer 30 of FIG. 6A. Interposer 30 includes electrode termination bands 320 and 321 to which all of the common conductive pathways are coupled are connected together at their respective electrode extensions 32 and 35. These common conductive electrode termination bands 320 and 321 can also be connected to a metalized portion of the IC package 310 and used as a "0" voltage reference node or connected to the circuit for portions of energy leaving the interposer 30 to an external connection (not shown) that serves as the low impedance pathway return. Interposer 30 also comprises differential electrode termination bands 330 corresponding to the first differential electrode 303 and termination bands 340 corresponding to the second differential electrode 305. Differential electrode termination bands 330 and 340 are utilized for receiving energy and provide a connection point for connections to energy-utilizing internal loads 370 of the IC die 380. It should be noted for the sake of depiction herein that interposer 30 is normally physically larger than the active component or IC it is attached to and conditioning energy for.

While there are many IC package pin-outs 350 located around the IC carrier edge 392 for signal in return pathways, there is only one pin-out utilized for energy entry, designated at 391B, and only one pin-out utilized for energy return, designated at 391A. The IC package 310 is designed such that multiple power entry points are reduced to one pair of power entry/return pins 391A and 391B which are connected to the differential electrode termination bands 340 and 330, respectively, by bond wires 393A, 393B or other conductive pathways, or conventional interconnects. The single power entry portal represented by pins 391A and 391B and the proximity of the electrode termination bands 330 and 340 of interposer 30 to the power entry portal reduces the noise that can enter or exit the integrated circuit and interfere with circuitry both internal or external to the integrated circuit package 310. The connections are by standard means known in the art such as, but not limited to, wire bond jump wires and the like and is determined by the final application needs of a user.

Turning to FIG. 7, and cross-sectional views of varied embodiments of FIG. 7, which are FIG. 8A and FIG. 8B, the applicants will move freely between all three drawings explaining interposer 60/61's, functions and makeup for the embodiments show herein.

In FIG. 7, interposer 60/61 is shown in this case a top view depiction and it is quickly noted that in most cases, but not all, the opposite sides view or appearance of interposer 60/61 is approximately the same as is shown in FIG. 7 the top view.

In one embodiment of the present invention, referring now to FIG. 7, interposer 60/61 comprises vias 63, 64 and 65, which provide conductive energy propagation pathway interconnections through a plurality of substrate layers within the body of interposer 60/61 encased in material 6312 and surrounded by conductive material 6309. This embodiment typically utilizes either a paired path or a three-path configuration. In a paired, or two path configuration, interposer 60/61 utilizes a paired two-way I/O circuit pathway using both VIAS 64 and VIAS 65 for IN energy propagation pathways, while using VIAS 66 for the OUT energy propagation pathways. Circuit reference nodes (not shown) could be found and utilized inside or adjacent to the AOC of interposer 60/61 by a portion of internal conductive pathways (not shown) pre-determined by the user for portions of propagating energy servicing the load or from inside the AOC, depending on exact connection circuitry outside the interposer 60/61.

A three-way conductive pathway I/O configuration is preferred and uses VIAS 65 for IN energy propagation, VIAS 64 for OUT pathed energy propagation or energy return, and uses the center VIAS 66 as a separate, common energy propagation pathway and reference attachment. VIAS 66 allow portions of energy propagating in either direction between an energy-utilizing load (not shown) and an energy source (not shown) to move to a low impedance energy pathway created within the AOC that can be pathed along externally designated common conductive pathways or areas outside of the AOC that would provide or share voltage potential for the circuitry within the interposer's AOC. This low impedance energy pathway, or area, is created as energy from external pathway circuitry is transferred through differential pathways 60C and 60D and continues on to external conductive pathways on either one or multiple sides of interposer 60/61. Portions of this energy propagating within the AOC of interposer 60/61 propagate to common conductive pathways 6200/6200-IM, 6201, 6202, 6203 and 6204/6204-IM and VIAs 66, which interconnects the common conductive pathways within the AOC of 60 in this case and allows the energy to propagate along to external common conductive pathways.

Depending on usage, there are some embodiment variations of interposer 61/60 not depicted in FIG. 8B and FIG. 8A, but are easily contemplated by the applicants that would have an IC mounting side only, with vias 64,65,66 configured to that shown in FIG. 7. Yet, depending on the external pathway connections that are to be made or utilized, a variant of interposer 60, an alternative invention interposer might only comprise one, two or three of the 64,65,66 conductive via groups with the same or alternate couplings to the perpendicularly disposed internal horizontal conductive pathways such as common pathways 6200/6200-IM, 6201,6202, 6203 and 6204/6204-IM, 60C and 60D.

FIG. 8B shows the common conductive via pathways 66 penetrating completely through to the opposing side 6312, yet a simple 2 way pathway configuration could utilize all 64 and 65 configured vias, (no via 66 penetrating to the opposing side 6312, but coupling just to the common pathways 6200/6200-IM, 6201,6202, 6203 and 6204/6204-IM, created) as just energy input pathways, while using the side conductive pathway 6308 created by the joining of common pathways 6200/6200-IM, 6201,6202, 6203 and 6204/6204-IM at 6308 as a return energy path, passing through from the vias 66 located as shown in FIG. 7 and moving through the internal AOC of device 60 and finally propagating outside the internal AOC of device 60 as portions of the energy return to its source by externally attached conductive pathways (not shown) such as wire bondings made to material 6308 or conductive attachment nodes (not shown). It should also be noted that dotted line 60E represents interposer embodiment 61 or similar boundary or demarcation line of its non-penetrating configuration of common conductive pathways 6200/6200-IM, 6201, 6202, 6203 and 6204/6204-IM that do not make a conductive attachment within to 6309 located on 6312S portions of interposers 60 & 61 and make coupling connections only to vias 66 as shown in FIG. 8A, and not to material 6308 as is shown for common conductive pathway electrodes 6200/6200-IM, 6201,6202, 6203 and 6204/6204-IM in FIG. 8B of interposer 60. In interposer 61 it must be emphasized that the common conductive pathway electrodes 6200/6200-IM, 6201,6202, 6203 and 6204/6204-IM do not penetrate material dielectric or insulative 6209 and emerge out to 6312S of this embodiment to join with conductive material 6309 that is applied on interposer embodiment 60 as shown on FIG. 8B. However, these common conductive pathway electrodes 6200/6200-IM, 6201,6202, 6203 and 6204/6204-IM still extend closer to 6312-S than do the 60D and 60C differential pathways as demarcated or delineated by dotted line 60F in FIG. 7. Because of this positioning of the differential and common pathways to one another interposers of the new invention will partake in the electrostatic shielding functions attributed to these types of pathway configurations, many of which are similarly described in detail within this disclosure.

These various pathway configurations reveal the versatility of the device and the that while the common conductive pathways 6200/6200-IM, 6201,6202, 6203 and 6204/6204-IM appear to have a limited positioning criteria, it must be noted that pathway vias 64,65,66 are much more flexible and versatile in positioning configurations, shape, sizes, and can be utilized to provide all sorts of energy conditioning functions and pathway configurations as one in the art or not can dream up. Interposer 60/61 is configured in a way that uses a multi-aperture, multilayer energy conditioning pathway sets and substrate embodiment in a substrate format for conditioning propagating energy along pathways servicing an active element such as, but not limited to, an integrated circuit chip or chips. Interposer 60/61 conditions propagating energy by utilizing a combined energy conditioning methodology of conductively filled apertures known in the art as VIAs, in combination with a multi-layer common conductive Faraday cage-like shielding technology with partially enveloped differential conductive electrodes or pathways. Interconnection of the substrate to the IC and to a mounting structure is contemplated with either wire bonding interconnection, flip-chip ball-grid array interconnections, microBall-grid interconnections, combinations thereof, or any other standard industry accepted methodologies.

As shown in FIGS. 7 and 8B, conductive material 6309 can be applied or deposited on side 6312S of Interposer 60 and can be utilized as an auxiliary energy return pathway. At energization, common conductive pathways 6200/6200-IM, 6201, 6202, 6203, 6204/6204-IM, VIAs 66, all shown in FIG. 8B, will form a path of least impedance with respect to the higher impedance pathways located along differential conductive pathways 60C and 60D as well as VIAS 65 or 64.

Thus, when energized, common conductive pathways 6200/6200-IM, 6201, 6202, 6203, 6204/6204-IM, VIAs 66 all shown in FIG. 8B and FIG. 8A are utilized as the "0" Voltage circuit reference node (not shown) found both inside and outside the common conductive interposer energy pathway configurations (not shown) as the interposer is electrically positioned in an energized circuit.

Interposer 60 is connected to an integrated circuit 4100 by commonly accepted industry connection methods. On one side of interposer 60, the various differentially conductive pathways including vias 65 are electrically connected between the energy source (not shown) and a load (not shown) and the various differentially conductive pathways including vias 64 are connected by common industry means between the energy utilizing load (not shown) and the energy source (not shown) on a return pathway that includes conductive pathway vias 66 for portions of propagating energy. It is understood in the art that vias 65 and 64 poses no polarity charge before hook-up that would prevent each from changing energy propagation functions such as from In put to an output function as long as consistency in species hook up is maintained, once initiated on the device.

FIG. 8A shows interposer 61 taken from a cross sectional view "A" of a main embodiment of energy conditioning interposer taken from FIG. 7 surrounded by non conductive exterior surface 6312. Interposer 61 comprises conductive differential energy pathway electrode 60-C that is coupled to conductive VIA pathway 64 and conductive differential energy pathway electrode 60-D that is coupled to conductive VIA pathway 65, each as designated at 6205 by standard industry known means. Differential energy pathway 60-C and differential energy pathway 60-D are separated from each other by central, shared, common conductive energy pathway 6202 and from the top and bottom of the interposer 61 by common conductive energy pathways 6200/6200-IM, 6201, and 6203, 6204/6204-IM, respectively. The common conductive energy pathways 6200/6200-IM, 6201, 6202, 6203, and 6204/6204-IM, are interconnected by conductive VIA pathway 66 as designated at 6308 by standard industry known means. The outer most common conductive energy pathways 6200/6200-IM and 6204/6204-IM act as image shield electrodes and are vertically spaced from their adjacent common conductive energy pathways 6201, 6203, respectively, as designated by 4011. Conductive via pathways 64, 65, and 66 are selectively isolated in a predetermined manner from common conductive energy pathways and differential conductive pathways by a gap 6307 which is space filled with dielectric medium or isolative or insulating material and can either be an actual deposited material or simply a void of conductive material that would prevents coupling of the various conductive interposer pathways.

It should be noted that conductive via pathways 64, 65 passes through the various conductive and dielectric material and is selectively coupled to interposer 61's conductive differential energy pathway electrodes as needed by the user. VIAs 64 and 65 can be chosen to receive energy input, either output or image pathway duties as needed with via 66. Conductive VIA pathways 64, 65, and 66 are electrically connected to external elements as previously discussed. These connections can be any industry-accepted type of connection. As shown in FIGS. 8A and 8B, a connection is made by applying adhesive or solder ball flux 4005, or an industry accepted contact material the of the for conductive seating pad 63 for gravity or adhesive placement processing using solder balls 4007 which is a eutectic-type solder ball or industry standard equivalent.

Now turning to FIG. 8B, interposer 60 is shown identical to that interposer 61 shown in FIG. 8A except that common conductive edge termination material 6309 extends along the sides of the interposer and surrounds the perimeter thereof as shown previously in FIG. 7. Also note that common conductive edge termination material 6309 is electrically connected to common conductive energy conditioning pathways 6200/6200-IM, 6201, 6202, 6203 and 6204/ 6204-IM and not done in FIG. 8A. Interposer 60 is also shown connected to an integrated circuit die 4100. The integrated circuit die 4100 is also shown with protective glob coating or encapsulment material 6212 just above the die surface. The energy conditioning interposer 60 is also mounted on a substrate 8007 or substrates to which the IC assembly will be attached either by ball grids 8009 and 8010 or by other means commonly used in the industry. The IC package pins 8009 provide interconnection to a substrate or socket connector containing signal and ground connections not necessarily going to interposer pathways, while 8010 pathway connections although not shown, could connect to interposer pathways for energy propagation. It should be noted that 4011 is the predetermined layering used or pathway spacing that is part of the invention consideration, universally. These interconnections are only to offer that they can be varied as to any standard industry means of connecting an IC package to a PCB, PCB card and the like. In the cases of MCM or SCM interconnections, interposer 60 or 61 can be directly attached to substrate circuitry with standard industry methodologies.

In FIG. 9, a close up of a portion of FIG. 8A reveals some of the actual external interconnecting elements for the VIA structures 64,65,66. It should be noted that the internal conductive pathways are typical but the coupling points are not shown herein. On-conductive material 6209 is also called out. Conductive capture pad 63 is disposed on one side of the non-conductive portion 6312 of the interposer 61 around conductive pathway via 66, which comprises a small diameter shaped pathway of conductive material 66A that is selectively coupled 6308 or non-coupled 6307 by standard means known in the art, either after vias are created either by a laser or drilling process that leaves a void for filling with material 66' during the manufacturing process or at the same time deposit of 66' is made that couples 6308 to common conductive pathways 6200/6200-IM, 6201, 6202, 6203 and 6204/6204-IM as shown in FIG. 8A. A capture pad 63 is also formed on the opposite side opening of the non-conductive material 6312 of the interposer 61 that coincides with conductive pathway via 66 leading to conductive capture pad 63 which is also deposited on the bottom of interposer 61. An adhesive solder ball flux an industry accepted contact material or primer 4005 is then applied and subsequently followed by application of conductive solder ball 4007 of the type commonly found in the art.

It is important to note that the actual manufacturing process used to make an invention embodiment 60 or 61 and subsequently attach it to an active chip, chips or IC and than to a mounting substrate can be accomplished in many ways. Rather FIG. 9 is an attempt to merely outline, in general terms, some of the many mounting procedures and connection materials that can be used, added, removed or are interchangeable and widely varied from manufacturer to manufacturer. Attachment materials and methodologies, overall for interposer invention described herein are not limited in any way. The critical nature of invention functionality, rather is simply determined more on the actual attachment arrangements made for the differently grouped, common conductive pathways and the differential conductive pathways to the external conductive pathways respectively, located outside the AOC that are key elements so long as energy pathways are conductively nominal for energy propagation.

Referring now to FIG. 10, the exterior, or underside of a prior art IC package is shown using an assembly of externally mounted, multiple low inductance capacitive devices 8001 utilized in a prior art configuration with the internally located prior art interposer. The IC package exterior 8007 is a standard configuration where pin outs emerge from one portion of the device for attachment to a mounting substrate, PCB or daughter card assembly, while other energy pathways utilize either combinations of ball grid sockets 8006 and pin outs or simply sockets 8006 while conductive pin-outs are used by other pathways such as signal lines, for example or other standard means used in the industry. Ball grid sockets 8004 are typically comprised for receipt of eutectic solder or the like and are typically configured around the inner region of the IC package 8002 rather than the exterior regions of 8007 to be closer for energy delivery to the internally mounted active chip or IC (not shown). The ball grid sockets 8004 are located within a perimeter or outline 8003 of the internal area location of the IC and interposer within the IC package 8007 as designated. Within the perimeter outline, ball grid sockets 8004 for interconnection are normally for energy supplying power by the I/O pathways 8005 of the IC package 8007. This prior art IC package is intended to show that the internally positioned prior art interposer (not shown) requires an assembly 8001 of low inductance capacitive array chip device in location 8002 to function properly.

In contrast, referring now to FIG. 11, the exterior, or underside of an IC package 8007 is utilizing an embodiment of the present invention mounted inside IC package 8007 as is shown, "ghosted" for ease of description. As before, the perimeter outline 8003 designates the location of the IC and interposer 8006 within the IC package 8007 and the perimeter is surrounded by ball grid sockets 8004. The mounted multi-aperture energy conditioning architecture device 60–61 or similar is shown as a interposer located between the integrated circuit or IC assembly (not shown) and the mounting substrate or in this depiction the mounting substrate used is the final layering or groups of layering making up the outside portion of substrate package 8007. It should be noted that interposer 60–61 or similar can also be utilized to provide for an additional physical shielding function utilized by the active IC chip or chips connected to said interposer as well as it also provides the simultaneous energy conditioning functions as described in the disclosure. Shielding of this nature is accomplished by interposers mere presence in the package as long as the active chip (not shown) does not have portions of its embodiment extending beyond the perimeter of interposer invention. Device 60 includes apertures 64 connected to internal energy conditioning electrode(s) 60C and apertures 65 connected to internal energy conditioning electrode(s) 60D. Conductive apertures 66 are connected to common conductive pathways 6200/6200-IM, 6201, 6202, 6203, and 6204/6204-IM or any additional pathways of the similar use that are utilized.

It should be noted that in all embodiments, it is optional but preferred that one set of outer common conductive pathways or layers designated as -IM should sandwich the entire stacking configuration, either placed in the manufacturing process of the entire device, perhaps utilized from part of the mounting substrate serving as a platform other than a discrete IC package or the IC package itself or even by utilizing an external conductive pathway or larger external conductive area, alone or with insulating material disposed between to take the place of at least one of the two outer common conductive pathways designated -IM. The prime set of outer common conductive pathways not designated as -IM and closely positioned to the described set of outer are critical to the device as the common conductive pathways that form the basis of the sidelining electrode sandwich and can only be made optional in cases where the final shield is replaced or substituted with an external conductive area that can fit most of the criteria described to allow the faraday cage-like shield structure to maintain integrity with respect to the energy conditioning functions desired. However in the case of the -IM designated shields they are optional yet desirable in that they will electrically enhance circuit conditioning performance and further shift outward the new interposers' self resonate point and enhance that portion of the circuit located within the AOC of the invention, as well.

It should be noted that if the common conductive container structures that make up an invention are in balance according to the result of the stacking sequence as described herein, any added or extra, single common conductive shield layers designated -IM beyond the primary set of common conductive pathways that are added by mistake or with forethought will not degrade energy conditioning operations severely and this condition in some cases can actually reveal a potential cost savings in the manufacturing process, wherein automated layering processes could possibly added one or more additional outer layer or layers as described and where the application performance may not be as critical.

It is disclosed that these errors, intentional or accidental will not detrimentally harm the balance of the invention containing the minimum properly sequenced stacking of common conductive pathways as discussed and is fully contemplated by the applicants.

At least five or more, distinctly different energy conditioning functions that can occur within any variation of the invention; electrostatic minimization of energy parasitics by almost total shield envelopment; a physical shielding of portions of the differential conductive pathways; an electromagnetic cancellation or minimization shielding function or mutual magnetic flux cancellation or minimization of opposing, closely positioned, differential conductive pathway pairs; utilization of a "0" voltage reference created by the central, common and shared pathway electrode, the sandwiching outer first set of common conductive pathways and any of the -IM designated pathways that are utilized as part of two distinct common conductive shield structure containers; a parallel propagation movement of portions of energy providing a shielding effect as opposed to a series propagation movement of energy effect of the portions of energy located within the AOC. A parallel propagation movement of portions of energy occurs when differentially phased energy portions operate in an opposing, yet harmonious fashion with said energies divide such that approximately ½ half of the total energies or portions found at any onetime within the AOC of the invention will be located on one side of the central common and shared conductive energy pathway in a electrical and/or magnetic operation utilizing its parallel, non-reinforcing counterpart that operates in a generally opposing cancellation or minimization-type manner or in a manner that does not enhance or create detrimental forces in a manner like that of the prior art which operates in a generally series-type manner despite the usage in a few cases of a mutual magnetic flux cancellation or minimization technique of opposing differential conductive pathway. Prior art due to its structure all but fails to utilize the simultaneous sandwiching electrostatic shielding function inherent in the new invention as has been described in this disclosure.

In all embodiments whether shown or not, the number of pathways, both common conductive pathway electrodes and differential conductive pathway electrodes, can be multiplied in a predetermined manner to create a number of conductive pathway element combinations a generally physical parallel relationship that also be considered electrically parallel in relationship with respect to these elements in an energized existence with respect to a circuit source will exist additionally in parallel which thereby add to create increased capacitance values.

Next, additional common conductive pathways surrounding the combination of a center conductive pathway and a plurality of conductive electrodes are employed to provide an increased inherent common conductive pathway and optimized Faraday cage-like function and surge dissipation area in all embodiments.

Fourth, although a minimum of one central common conductive shield paired with two additionally positioned and sandwiching common conductive pathways or shields are generally desired and should be positioned on opposite sides of the central common conductive shield (other elements such as dielectric material and differential conductive electrode pairs, each positioned on opposite sides of said central common layer can be located between these shields as described). Additional common conductive pathways can be employed such as the -IM designated shields that do not have a differential conductive pathway adjacent to its position with any of the embodiments shown and is fully contemplated by Applicant.

Finally, from a review of the numerous embodiments it should be apparent that the shape, thickness or size may be varied depending on the electrical characteristics desired or upon the application in which the filter is to be used due to the physical architecture derived from the arrangement of common conductive electrode pathways and their attachment structures that form at least one single conductively homogenous Faraday cage-like conductive shield structure with conductive electrode pathways.

Although the principals, preferred embodiments and preferred operation of the present invention have been described in detail herein, this is not to be construed as being limited to the particular illustrative forms disclosed. It will thus become apparent to those skilled in the art that various modifications of the preferred embodiments herein can be made without departing from the spirit or scope of the invention as defined by the appended claims.

What is claimed is:

1. An integral capacitor comprising:
   a power plane having a power surface and a power periphery, the power plane coupling power to signals of an integrated circuit operating at a fundamental frequency;
   a first ground plane having a first ground surface and a first ground periphery, the first ground plane coupling ground to the signals, the first ground plane being separated from the power plane by a first distance, the first ground surface being larger than the power surface;
   the first ground periphery extending at least a second distance from the power periphery, the second distance being at least larger than N times the first distance; and
   a dielectric layer formed between the power plane and the first ground plane.

2. The integral capacitor of claim 1 further comprising:
   a second ground plane having a second ground surface and a second ground periphery, the second ground plane being separated from the power plane by the third distance;
   the second ground surface being larger than the power surface and the second ground periphery extending at least a fourth distance from the power periphery;
   the fourth distance being at least larger than M times the third distance, the second ground plane being coupled to the first ground plane by a via chain connecting a first plurality of vias located around the first ground periphery to a second plurality of vias located around the second ground periphery; and
      the first and second pluralities of vias having adjacent vias, the adjacent vias being spaced apart by a via distance that is smaller than a quarter wavelength of the fundamental frequency.

3. The integral capacitor of claim 1 wherein the dielectric layer is made of a dielectric material having a high dielectric constant.

4. The integral capacitor of claim 1 wherein N is an integer ranging from 1 to 20.

5. The integral capacitor of claim 1 wherein M is an integer ranging from 1 to 20.

6. The integral capacitor of claim 1 wherein the first plurality of vias having electrical contact to a plurality of adjacent contacts, the adjacent contacts being spaced apart by a contact distance that is smaller than a quarter wavelength of the fundamental frequency.

7. The integral capacitor of claim 6 wherein the contacts are ones of controlled collapse chip connection (C4) bumps, ball grid array (BGA) balls, and flip chip pin grid array (FCPGA) pins.

8. The integral capacitor of claim 1 further comprises a contact array to connect to at least the first ground plane and the power plane.

9. The integral capacitor of claim 8 wherein the contact array is one of a C4 bump array, a BGA ball array, and a FCPGA pin array.

10. The integral capacitor of claim 9 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

11. A packaged device comprising:
    a die containing an integrated circuit;
    a plurality of controlled collapse chip connection (C4) bumps attaching the die to a substrate; and
    an integral capacitor attaching to the die to reduce radiation, the integral capacitor comprising: a power plane having a power surface and a power periphery, the power plane coupling power to signals of an integrated circuit operating at a fundamental frequency, a first ground plane having a first ground surface and a first ground periphery, the first ground plane coupling ground to the signals, the first
    ground plane being separated from the power plane by a first distance, the first ground surface being larger than the power surface and the first ground periphery extending at least a second distance from the power periphery, the second distance being at least larger than N times the first distance, and a dielectric layer formed between the power plane and the first ground plane.

12. The packaged device of claim 11 wherein the integral capacitor further comprising:
    a second ground plane having a second ground surface and a second ground periphery, the second ground plane being separated from the power plane by the third distance, the second ground surface being larger than the power surface and the second ground periphery extending at least a fourth distance from the power periphery, the fourth distance being at least larger than M times the third distance, the second ground plane being coupled to the first ground plane by a via chain connecting a first plurality of vias located around the first ground periphery to a second plurality of vias located around the second ground periphery, the first and second pluralities of vias having adjacent vias, the adjacent vias being spaced apart by a via distance that is smaller than a quarter wavelength of the fundamental frequency.

13. The packaged device of claim 12 wherein the dielectric layer is made of a dielectric material having a high dielectric constant.

14. The packaged device of claim 11 wherein N is an integer ranging from 1 to 20.

15. The packaged device of claim 11 wherein M is an integer ranging from 1 to 20.

16. The packaged device of claim 11 wherein the first plurality of vias having electrical contact to a plurality of adjacent contacts, the adjacent contacts being spaced apart by a contact distance that is smaller than a quarter wavelength of the fundamental frequency.

17. The packaged device of claim 16 wherein the contacts are ones of controlled collapse chip connection (C4) bumps, ball grid array (BGA) balls, and flip chip pin grid array (FCPGA) pins.

18. The packaged device of claim 11 wherein the integral capacitor further comprises a contact array to connect to at least the first ground plane and the power plane.

19. The packaged device of claim 18 wherein the contact array is one of a C4) bump array, a BGA ball array, and a FCPGA pin array.

20. The packaged device of claim 19 wherein the ground plane has a plurality 15 of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter, wavelength of the fundamental frequency.

21. A method comprising:
coupling power to signals of an integrated circuit operating at a fundamental frequency by a power plane having a power surface and a power periphery;
coupling ground to the signals by a first ground plane having a first ground surface and a first ground periphery, the first ground plane being separated from the power plane by a first distance, the first ground surface being larger than the power surface and the first ground periphery extending at least a second distance from the power periphery, the second distance being at least larger than N times the first distance; and
forming a dielectric layer between the power plane and the first ground plane.

22. The method of claim 21 further comprising:
coupling a second ground plane to the first ground plane by a via chain, the second ground plane having a second ground surface and a second ground periphery, the second ground plane being separated from the power plane by the third distance, the second ground surface being larger than the power surface and the second ground periphery extending at least a fourth distance from the power periphery, the fourth distance being at least larger than M times the third distance, the via chain connecting a first plurality of vias located around the first ground periphery to a second plurality of vias located around the second ground periphery, the first and second pluralities of vias having adjacent vias, the adjacent vias being spaced apart by a via distance that is smaller than a quarter wavelength of the fundamental frequency.

23. The method of claim 22 wherein the dielectric layer is made of a dielectric material having a high dielectric constant.

24. A method of claim 21 wherein N is an integer ranging from 1 to 20.

25. The method of claim 21 wherein M is an integer ranging from 1 to 20.

26. The method of claim 21 wherein the first plurality of vias having electrical contact to a plurality of adjacent contacts, the adjacent contacts being spaced apart by a contact distance that is smaller than a quarter wavelength of the fundamental frequency.

27. The method of claim 26 wherein the contacts are ones of controlled collapse chip connection (C4) bumps, ball grid array (BGA) balls, and flip chip pin grid array (FCPGA) pins.

28. The method of claim 21 further comprises connecting to at least the first ground plane and the power plane by a contact array.

29. The method of claim 28 wherein the contact array is one of a C4 bump array, a BGA ball array, and a FCPGA pin array.

30. The method of claim 29 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

31. An energy conditioner comprising;
a first pathway having a first surface and a first perimeter, and the first pathway coupled to an integrated circuit;
a second pathway having a second surface and a second perimeter, and the second pathway coupled to the integrated circuit;
the second pathway being separated from the first pathway by a first distance;
the second surface being larger than the first surface;
the second perimeter extending at least a second distance from the first perimeter;
the second distance being at least larger than a number times the first distance; and
a dielectric layer formed between the first pathway and the second pathway.

32. An enclosure comprising:
a power plane having a power surface and a power periphery, the power plane coupling power to signals of an integrated circuit operating at a fundamental frequency; and
first and second ground planes having first and second ground surfaces and first and second ground peripheries, the first and second ground planes coupling ground to the signals, the first and second ground planes being separated from the power plane by first and second distances, respectively, the first and second ground surfaces being larger than the power surface, the first and second ground peripheries extending at least third and fourth distances from the power peppery, respectively, the third and fourth distances being N and M times larger than the first and second distances, respectively.

33. The enclosure of claim 32 wherein the first and second ground planes have first and second pluralities of vias located around the first and second ground peripheries, respectively, and outside the power periphery, the first and second pluralities of vias having adjacent vias, the adjacent vias being spaced apart by a via distance that is smaller than a quarter wavelength of the fundamental frequency, the first and second pluralities of vias being connected by a via chain.

34. The enclosure of claim 33 wherein the signals are on a signal plane located between the power plane and the second ground plane.

35. The enclosure of claim 32 wherein N is an integer ranging from 1 to 20.

36. The enclosure of claim 32 wherein M is an integer ranging from 1 to 20.

37. The enclosure of claim 32 wherein the first plurality of vias having electrical contact to a plurality of adjacent contacts, the adjacent contacts being spaced apart by a contact distance that is smaller than a quarter wavelength of the fundamental frequency.

38. The enclosure of claim 37 wherein the contacts are ones of controlled collapse chip connection (C4) bumps, ball grid array (BGA) balls, and flip chip pin grid array (FCPGA) pins.

39. The enclosure of claim 32 further comprises a contact array to connect to at least the first ground plane and the power plane.

40. The enclosure of claim 39 wherein the contact array is one of a C4 bump array, a BGA ball array, and a FCPGA pin array.

41. The enclosure of claim 40 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

42. A packaged device comprising:
a die containing an integrated circuit having signals operating at a fundamental frequency;
a plurality of controlled collapse chip connection (C4) bumps attaching the die to a substrate; and an enclosure attaching to the die to reduce radiation, the enclosure comprising:

a power plane having a power surface and a power periphery, the power plane coupling power to the signals of the integrated circuit, and first and second ground planes having first and second ground surfaces and first and second ground peripheries, the first and second ground planes coupling ground to the signals, the first and second ground planes being separated from the power plane by first and second distances, respectively, the first and second ground surfaces being larger than the power surface, the first and second ground peripheries extending at least third and fourth distances from the power periphery, respectively, the third and fourth distances being N and M times larger than the first and second distances, respectively.

43. The packaged device of claim 42 wherein the first and second ground planes have first and second pluralities of vias located around the first and second ground peripheries, respectively, and outside the power periphery, the first and second pluralities of vias having adjacent vias, the adjacent vias being spaced apart by a via distance that is smaller than a quarter wavelength of the fundamental frequency, the first and second pluralities of vias being connected by a via chain.

44. The packaged device of claim 43 wherein the signals are on a signal plane located between the power plane and the second ground plane.

45. The packaged device of claim 42 wherein N is an integer ranging from 1 to 20.

46. The packaged device of claim 42 wherein M is an integer ranging from 1 to 20.

47. The packaged device of claim 42 wherein the first plurality of vias having electrical contact to a plurality of adjacent contacts, the adjacent contacts being spaced apart by a contact distance that is smaller than a quarter wavelength of the fundamental frequency.

48. The packaged device of claim 47 wherein the contacts are ones of controlled collapse chip connection (C4) bumps, ball grid array (BGA) balls, and flip chip pin grid array (FCPGA) pins.

49. The packaged device of claim 42 wherein the enclosure further comprises a contact array to connect to at least the first ground plane and the power plane.

50. The packaged device of claim 49 wherein the contact array is one of a C4 bump array, a BGA ball array, and a FCPGA pin array.

51. The packaged device of claim 50 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

52. A method comprising:

coupling power to signals of an integrated circuit operating at a fundamental frequency by a power plane having a power surface and a power periphery; and coupling pound to the signals by first and second ground planes having first and second ground surfaces and first and second ground peripheries, the first and second ground planes being separated from the power plane by first and second distances, respectively, the first and second ground surfaces being larger than the power surface, the first and second ground peripheries extending at least third and fourth distances from the power periphery, respectively, the third and fourth distances being N and M times larger than the first and second distances, respectively.

53. The method of claim 52 wherein the first and second ground planes have first and second pluralities of vias located around the first and second ground peripheries, respectively, and outside the power periphery, the first and second pluralities of vias having adjacent vias, the adjacent vias being spaced apart by a via distance that is smaller than a quarter wavelength of the fundamental frequency, the first and second pluralities of vias being connected by a via chain.

54. The method of claim 53 wherein the signals are on a signal plane located between the power plane and the second ground plane.

55. The method of claim 52 wherein N is an integer ranging from 1 to 20.

56. The method of claim 52 wherein M is an integer ranging from 1 to 20.

57. The method of claim 52 wherein the first plurality of vias having electrical contact to a plurality of adjacent contacts, the adjacent contacts being spaced apart by a contact distance that is smaller than a quarter wavelength of the fundamental frequency.

58. The method of claim 57 wherein the contacts are ones of controlled collapse chip connection (C4) bumps, ball grid array (BGA) balls, and flip chip pin grid array (FCPGA) pins.

59. The method of claim 52 further comprises connecting to at least the first ground plane and the power plane by a contact array.

60. The method of claim 59 wherein the contact array is one of a C4 bump array, a BGA ball array, and a FCPGA pin array.

61. The method of claim 60 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

* * * * *

UNITED STATES PATENT AND TRADEMARK OFFICE
CERTIFICATE OF CORRECTION

| | | |
|---|---|---|
| PATENT NO. | : 7,110,227 B2 | Page 1 of 1 |
| APPLICATION NO. | : 10/237079 | |
| DATED | : September 19, 2006 | |
| INVENTOR(S) | : Anthony et al. | |

It is certified that error appears in the above-identified patent and that said Letters Patent is hereby corrected as shown below:

Column 1, after line 35, add the following paragraph:

This application incorporates by reference all of the disclosure, including the specification, claims, and figures in application number PCT/US01/30295, filed September 27, 2001.

Signed and Sealed this

Eleventh Day of November, 2008

JON W. DUDAS
*Director of the United States Patent and Trademark Office*

UNITED STATES PATENT AND TRADEMARK OFFICE
CERTIFICATE OF CORRECTION

PATENT NO.         : 7,110,227 B2
APPLICATION NO.    : 10/237079
DATED              : September 19, 2006
INVENTOR(S)        : Anthony A. Anthony et al.

Page 1 of 1

It is certified that error appears in the above-identified patent and that said Letters Patent is hereby corrected as shown below:

Column 37:
- claim 2, line 24, "the third" should be changed to --a third--.
- claim 6, line 46, "the first" should be changed to --a first--.

Column 38:
- claim 11, line 9, "signals of an" should be changed to --signals of the--.
- claim 12, line 25, "the third" should be changed to --a third--.
- claim 16, line 46, "the first" should be changed to --a first--.
- claim 19, line 59, "C4)" should be changed to --C4--.
- claim 20, line 62, "15" should be deleted.
- claim 20, line 66, "quarter," should be changed to --quarter--.

Column 39:
- claim 21, line 6, "5" should be deleted.
- claim 22, line 20, "the third distance" should be changed to --a third distance--.
- claim 26, line 39, "the first plurality" should be changed to --a first plurality--.
- claim 31, line 60, ";" should be changed to --:--.

Column 40:
- claim 32, line 21, "peppery" should be changed to --periphery--.
- claim 37, line 41, "the first plurality" should be changed to --a first plurality--.

Column 41:
- claim 47, line 34, "the first" should be changed to --a first--.

Column 42:
- claim 52, line 5, "pound" should be changed to --ground--.
- claim 57, line 33, "the first plurality" should be changed to --a first plurality--.

Signed and Sealed this
Twenty-eighth Day of June, 2011

David J. Kappos
*Director of the United States Patent and Trademark Office*